United States Patent [19]

Reid

[11] Patent Number: 4,866,604
[45] Date of Patent: Sep. 12, 1989

[54] DIGITAL DATA PROCESSING APPARATUS WITH PIPELINED MEMORY CYCLES

[75] Inventor: Robert Reid, Dunstable, Mass.

[73] Assignee: Stratus Computer, Inc., Marlboro, Mass.

[21] Appl. No.: 227,471

[22] Filed: Aug. 1, 1988

Related U.S. Application Data

[63] Continuation of Ser. No. 896,667, Aug. 14, 1986, abandoned, which is a continuation-in-part of Ser. No. 762,039, Aug. 2, 1985, Pat. No. 4,654,857, which is a continuation of Ser. No. 307,632, Oct. 1, 1981, abandoned.

[51] Int. Cl.⁴ ............................................. G06F 9/38
[52] U.S. Cl. ............................ 364/200; 364/231.8
[58] Field of Search ............... 364/200, 900; 365/222

[56] References Cited

U.S. PATENT DOCUMENTS

| | | | |
|---|---|---|---|
| 3,469,239 | 9/1969 | Richmond et al. | 340/172 |
| 3,533,065 | 10/1970 | McGilvray et al. | 340/172 |
| 3,533,082 | 10/1970 | Schnabel et al. | 340/172 |
| 3,544,973 | 12/1970 | Borck, Jr. et al. | 340/172 |
| 3,548,382 | 12/1970 | Lichty et al. | 340/172 |
| 3,560,935 | 2/1971 | Beers | 340/172 |
| 3,609,704 | 9/1971 | Schurter | 340/172 |
| 3,641,505 | 2/1972 | Artz et al. | 340/172 |
| 3,665,173 | 5/1972 | Bouricius et al. | 235/153 |
| 3,688,274 | 8/1972 | Cormier et al. | 340/172 |
| 3,736,566 | 5/1973 | Anderson et al. | 340/172 |
| 3,768,074 | 10/1973 | Sharp et al. | 340/172 |
| 3,795,901 | 3/1974 | Boehm et al. | 340/172 |
| 3,805,039 | 4/1974 | Stiffler | 235/153 |
| 3,820,079 | 6/1974 | Bergh et al. | 340/172 |
| 3,840,861 | 10/1974 | Amdahl et al. | 340/172 |
| 3,879,712 | 4/1975 | Edge et al. | 340/172 |
| 3,893,084 | 7/1975 | Kotok et al. | 340/172 |
| 3,895,353 | 7/1975 | Dalton | 340/172 |
| 3,984,814 | 10/1976 | Bailey, Jr. et al. | 340/172 |
| 3,991,407 | 11/1976 | Jordan, Jr. et al. | 340/172 |
| 3,997,896 | 12/1976 | Cassarino, Jr. et al. | 340/172 |
| 4,001,783 | 1/1977 | Monahan et al. | 340/172 |
| 4,015,243 | 3/1977 | Kurpanek et al. | 340/172 |
| 4,015,246 | 3/1977 | Hopkins, Jr. et al. | 340/172 |
| 4,032,893 | 6/1977 | Moran | 340/166 |
| 4,040,034 | 8/1977 | Belady et al. | 364/200 |

(List continued on next page.)

FOREIGN PATENT DOCUMENTS

| | | |
|---|---|---|
| 1802999 | 11/1969 | Fed. Rep. of Germany . |
| 8100925 | 4/1981 | PCT Int'l Appl. . |
| 1200155 | 7/1970 | United Kingdom . |
| 2060229 | 4/1981 | United Kingdom . |

OTHER PUBLICATIONS

"A Highly Efficient Redundancy Scheme: Self-Purging...", J. Losg, IEEE Transactions on Computers, V. c-25, N. 6, Jun. 1976, pp. 569-578.

The Architecture of Pipelined Computers, P. M. Kogge, McGraw-Hill.

(List continued on next page.)

Primary Examiner—Raulfe B. Zache
Attorney, Agent, or Firm—Lahive & Cockfield

[57] ABSTRACT

A digital data processing apparatus utilizes a common bus structure for transferring information between functional units, including a processing unit, a peripheral control unit, and first and second memory units. Unit-to-unit information transfers are executed on the bus structure by pipelining signals representative of a transfer cycle that occurs during plural timing intervals and includes plural phases, where the phases of one cycle are non-overlapping and occur in sequence in different respective timing intervals of the transfer cycle. A signalling element periodically generates a first signal indicative the necessity to refresh at least one dynamic memory element in the first memory unit. A memory refresh element normally responds to that first signal for executing a memory refresh cycle during at least one timing interval common to first and second pipelined transfer cycles. A signal is generated indicating the onset of the memory refresh cycle. A memory update element can respond to the update cycle for transferring information from the first memory unit to the second memory unit during a timing interval common to first and second pipelined transfer cycles. The update element generates a signal indicating of the onset of the update cycle.

12 Claims, 8 Drawing Sheets

U.S. PATENT DOCUMENTS

| | | | |
|---|---|---|---|
| 4,059,736 | 11/1977 | Perucca et al. | 179/175 |
| 4,075,693 | 2/1978 | Fox et al. | 364/200 |
| 4,096,571 | 6/1978 | Vander Mey | 364/200 |
| 4,096,572 | 6/1978 | Namimoto | 364/200 |
| 4,099,234 | 7/1978 | Woods et al. | 364/200 |
| 4,112,488 | 9/1978 | Smith, III | 364/200 |
| 4,130,240 | 12/1978 | Millham et al. | 235/303 |
| 4,150,428 | 4/1979 | Inrig et al. | 364/200 |
| 4,159,470 | 6/1979 | Strojny et al. | 340/147 |
| 4,167,782 | 9/1979 | Joyce et al. | 364/200 |
| 4,174,536 | 11/1979 | Misunas et al. | 364/200 |
| 4,177,510 | 12/1979 | Appell et al. | 364/200 |
| 4,190,821 | 2/1980 | Woodward | 340/147 |
| 4,228,496 | 10/1980 | Katzman et al. | 364/200 |
| 4,233,682 | 11/1980 | Liebergot et al. | 371/68 |
| 4,245,344 | 1/1981 | Richter | 371/68 |
| 4,253,147 | 2/1981 | MacDougall et al. | 364/200 |
| 4,263,649 | 4/1981 | Lapp, Jr. | 364/200 |
| 4,279,034 | 7/1981 | Baxter | 371/8 |
| 4,292,669 | 9/1981 | Wollum et al. | 364/200 |
| 4,304,001 | 12/1981 | Cope | 371/8 |
| 4,310,879 | 12/1982 | Pandeya | 364/200 |
| 4,323,966 | 4/1982 | Whiteside et al. | 364/200 |
| 4,347,563 | 8/1982 | Paredes et al. | 364/137 |
| 4,354,267 | 10/1982 | Mori et al. | 371/11 |
| 4,356,546 | 10/1982 | Whiteside et al. | 364/200 |
| 4,356,550 | 10/1982 | Katzman et al. | 364/200 |
| 4,363,094 | 12/1982 | Kaul et al. | 364/200 |
| 4,365,295 | 12/1982 | Katzman et al. | 364/200 |
| 4,378,588 | 3/1983 | Katzman et al. | 364/200 |
| 4,410,983 | 10/1983 | Cope | 371/8 |
| 4,428,044 | 1/1984 | Liron | 364/200 |
| 4,438,494 | 3/1984 | Budde et al. | 364/200 |
| 4,453,215 | 6/1984 | Reid | 364/200 |
| 4,486,826 | 12/1984 | Wolff et al. | 364/200 |

OTHER PUBLICATIONS

"Standard Specification for S-100 Bus Interface Devices", K. A. Elmquist et al., Computer, Jul. 1979, vol. 12, No. 7, pp. 28-52.

"Design Motivations for Multiple Processor Microcomputer Systems", G. Adams et al., Computer Design, pp. 81-89.

"C.mmp—A Multi-Mini-Processor", W. A. Wulf et al., Afips Conference Proceedings, 1972 Computer Conference, V. 41, Pt. II, pp. 765-777.

"Fault Tolerant Systems", and Error Detection, T. Anderson et al., Fault Tolerance Principles and Practice, Prentice-Hall, 1981, pp. 93-145.

"Fault-Tolerant Microcomputer Systems for Aircraft", P. G. Depledge et al., pp. 205-220.

"Multiprocessor Organization—A Survey", P. H. Enslow, Jr., Computing Surveys, vol. 9, No. 1, Mar. 1977, pp. 103-129.

"Error Detecting and Error Correcting Codes", R. W. Hamming, The Bell System Technical Journal, vol. XXVI, No. 2, Apr. 1950, pp. 147-160.

"Organization of No. 1 ESS Central Processor", J. A. Harr et al., The Bell System Technical Journal, Sep. 1964, pp. 1845-2023.

"Pluribus—An Operational Fault-Tolerant Multiprocessor", D. Katsuki et al., Proceedings of the IEEE, V. 66, N. 10, Oct. 1978, pp. 1146-1159.

"A Hardware Redundancy Reconfiguration Scheme . . . ", S. Y. Su et al., IEEE Transactions on Computers, V. c-29, N. 3, Mar. 1980, pp. 254-258.

"The MIMD Organization—Multiprocessing", G. W. Gorsline, Computer Organization Hardware/Software, Prentice-Hall, 1980, pp. 221-227.

"Multiprocessor System Organization", M. M. Mano, Computer System Architecture, Prentice-Hall, 1982, pp. 454-473.

"Computers People Can Count On", T. Manuel, Electronics, Jan. 27, 1983, p. 93.

"Fault-Tolerant Computers—Multiprocessor Architecture Tunes in to Transaction Processing", K. Cohen, Electronics, Jan. 27, 1983, pp. 94-97.

"Fault-Tolerant Computers—Industrial-Control System Does Things in Threes for Safety", J. Wensley, Electronics, Jan. 27, 1983, pp. 98-102.

"Fault-Tolerant Computers—A Hardware Solution to Part Failures Totally Insulates . . . ", G. Hendrie, Electronics, Jan. 27, 1983, pp. 103-105.

"Architectures for Fault-Tolerant Spacecraft Computers", D. A. Rennels, Proceedings of the IEEE, V. 66, N. 10, Oct. 1978, pp. 1255-1268.

"N-Fail-Safe Logical Systems", T. Takaoka et al., IEEE Transactions on Computers, V. c-20, N. 5, May 1971, pp. 536-542.

DIGITAL DATA PROCESSING APPARATUS WITH PIPELINED MEMORY CYCLES

REFERENCE TO RELATED APPLICATIONS

This application is a continuation of application Serial No. 896,667, filed 8/14/86 abandoned which is a continuation-in-part of Serial No. 762,039 filed 8/2/85 now U.S. Pat. No. 4,654,857 which is a continuation of Serial No. 307,632 filed 10/1/89 now abandoned. This application is related to the following commonly-assigned United States patents and patent applications:

| Title | Ser. or Pat. No. |
|---|---|
| "Digital Data Processor with High Reliability" | U.S. Pat. No. 4,654,857 |
| "Digital Data Processor with Fault Tolerant Bus Protocol" | Ser. No. 904,827, filed 9/8/86 (a Cont. of USSN 307,436, filed 10/1/81) |
| "Central Processing Apparatus" | U.S. Pat. No. 4,453,215 |
| "Computer Memory Apparatus" | U.S. Pat. No. 4,597,084 |
| "Computer Peripheral Control Apparatus" | U.S. Pat. No. 4,486,826 |

BACKGROUND OF THE INVENTION

The invention relates to digital data processing apparatus and, more particularly, to memory units for fault-tolerant computers.

Faults in digital computer systems are inevitable and are due, at least in part, to the complexity of the circuits, the associated α electromechanical devices, and the process control software. To permit system operation even after the occurrence of a fault, the art has developed a number of fault-tolerant designs. Among these is Rennels, "Architecture for Fault-Tolerant Spacecraft Computers", proceedings of the I.E.E.E., Vol. 66, No. 10, pp. 1255-1268 (1975), disclosing a computer system comprised of independent self-checking modules. In the event of failure of a sub-component of one of the modules, the entire SCCM is taken off-line for diagnostic testing.

An improved fault-tolerant digital data processing system is currently available from the assignee hereof, Stratus Computer Company, of Marlboro, Mass. This system employs redundant functional unit pairs, e.g., dual redundant memory units, providing continuous. Processing in the event one unit of the pair fails. The functional units of the Stratus System are interconnected for information transfer on a common bus structure. The transfers are pipelined; that is, each unit-to-unit transfer occurs during plural phases and overlaps the Phases of other unit-to-unit transfers. Various aspects of this Stratus computer system are disclosed and claimed in the aforementioned related patents and patent applications.

The currently available Stratus system includes, in one of embodiment, dual redundant memory units. In the event one of these units becomes faulty, an update feature facilities copying information from the original non-faulty partner to a replacement memory unit. This update feature operates under the control of the system's central processing unit, which reads information on word-by-word basis from the original, non-faulty unit and writes that information to the new unit. Memory transfers carried out in this manner must arbitrate for the bus with all other system tasks and, thus, on a busy system, can take substantial time to complete.

With respect to timing functions, the art provides numerous computer systems in which time-of-day information is obtained via function calls to the operating system. Whenever such a function call is made, e.g., by a peripheral control unit, the time-of-day information will not become available until after the central processing unit is freed from other intervening tasks.

With this background, an object of the invention is to provide an improved digital data processing system. More particularly, an object of the invention is to provide an improved memory device for a fault-tolerant computer.

An object of the invention is also to provide a memory device for a fault-tolerant computer, which memory device can operate in conjunction with a duplicated partner unit to perform memory updates quickly, even when the computer system as a whole is busy.

Still further, an object of the invention is to provide a computer system in which time-of-day information can be obtained without awaiting action by the operating system.

Still other objects of the inventions are evident in the description which follows.

SUMMARY OF THE INVENTION

The above objects are attained by the invention, which provides in one aspect an improved digital data processing apparatus utilizing a common bus structure for transferring information between the system functional units. The units can include a processing unit, a peripheral control unit, and first and second memory units. A system clock is connected with the functional units for providing signals defining successive timing intervals.

Each functional unit can have a duplicate partner unit. Aside from peripheral device control units which operate with asynchronous devices, the functional units normally operate in lock-step synchronism with their partner units. For example, the system can employ two partner memory units which drive the bus structure and are driven by the bus structure synchronously.

The digital data processing apparatus executes a unit-to-unit information transfer by sending on the bus structure signals representative of a transfer cycle. This cycle occurs during plural timing intervals and includes plural phases, including a definition phase which can include addressing, a response phase, and a data-transfer phase. The phases of one transfer cycle are non-overlapping and occur in sequence in different respective timing intervals of the cycle. The system is arranged for pipelining, i.e., transferring concurrently on the bus structure signals representative of differing phases of plural cycles.

The system includes a memory update element responsive to a refresh signal and an update signal for executing a memory update process that transfers memory information from the first memory unit to the second memory unit. The memory update element includes an element for initiating the update cycle during a first timing interval common to first and second pipelined transfer cycles. The memory update element further includes an element for generating a BUSY signal indicative of the onset of the update cycle. The functional units include a pipeline-interrupt element responsive to detection of a BUSY signal for aborting further execution of the first transfer cycle, while continuing the execution of said second transfer cycle.

In another aspect, the invention provides a digital data processing apparatus of the type described above in which the memory update element includes an update-extension element. This latter element extends the memory update cycle to include the transfer of further update information from the first memory unit to the second memory unit. This further transfer occurs during timing intervals subsequent to the timing interval of the initial portion of the update cycle. Like the memory update element itself, the update-extension element includes an element for generating a BUSY signal indicative of the transfer of further update information.

The invention provides in another aspect an improvement for a digital data processing apparatus of the type having functional units which include a memory unit responsive to memory addressing signals for generating signals representative of information stored at the addressed locations. The improvement is characterized by a time-of-day clock responsive to such memory addressing signals for generating a signal representative of the time of day.

In a related aspect, the invention provides an improved digital data processing apparatus of the type described above in which the time-of-day clock includes an element for generating a signal indicative of the necessity to refresh at least some of the dynamic memory elements of the memory unit.

These and other aspects and features of the invention are evident in the drawings and the description which follow.

DESCRIPTION OF ILLUSTRATED EMBODIMENTS

Figure 1:
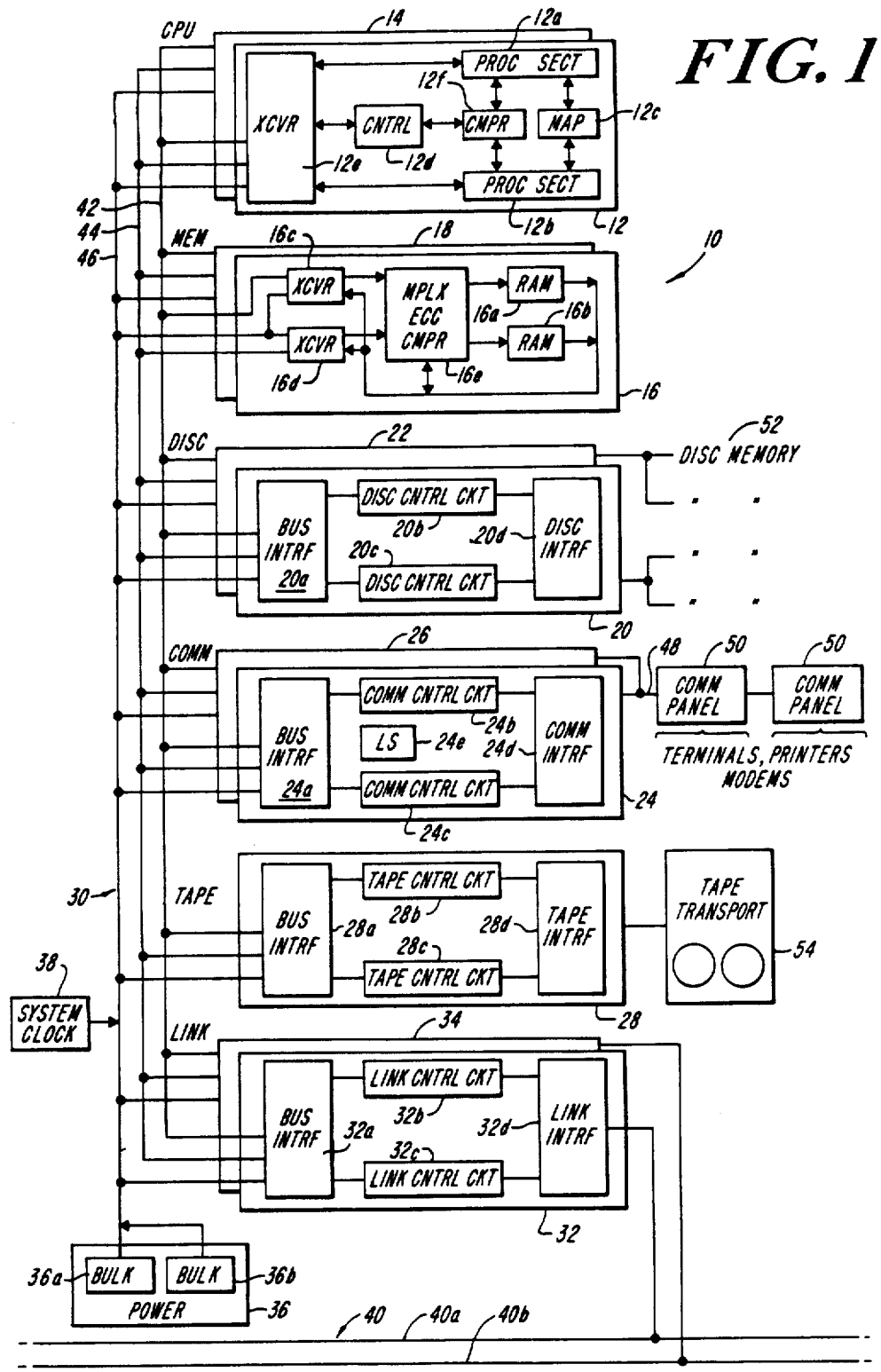
FIG. 1 depicts a digital data processor of the type used in a preferred practice of the invention.

A digital data processor 10 according to the invention has, as FIG. 1 shows, a central processing unit (CPU) 12, a main memory unit 16, and control units for peripheral input/output devices, including, for example, a disc control unit 20, a communication control unit 24, a tape control unit 28, and a link control unit 32. A single common bus structure 30 interconnects the units to provide all information transfers and other signal communications between them. The bus structure 30 also provides operating power to the units of the module from a main supply 36 and provides system timing signals from a main clock 38.

The bus structure 30 includes two identical buses 42 and 44, termed an A bus, a B bus, and an X bus 46. In general, the signals on the A bus and on the B bus execute information transfers between units of the module 10. Accordingly, these buses carry function, address, and data signals. The X bus in general carries signals that serve multiple units in the module. These include main power, timing, status and fault-responsive signals. Each unit 12 through 28, 32 and 34 is connected to all three buses of the bus structure 30. This enables each unit to transfer signals on either or both the A bus and the B bus, as well as on the X bus.

With further reference to FIG. 1, each functional unit of the module 10 can have a back-up redundant partner unit. Accordingly, the illustrated module has a second central processing unit 14, a second memory unit 18, a second disc control unit 22, a second communication control unit 26, and a second link control unit 34.

System Operation

The basic operation of the system 10 is that, in the absence of a fault, the partnered functional units, except those controlling asynchronous peripheral devices, operate in lock-step synchronism with one another. Thus, for example, both memory units 16, 18 drive the A bus and the B bus identically, and both are driven identically by the two buses. The same is true for the partner central processing units 12 and 14 and again for the partner communication control units 24 and 26. Further, both communication control units 24 and 26 jointly drive and are driven by a communication bus 48 that connects to one or more communication panels 50 which are connected to conventional communication devices such as keyboards, cathode ray tube terminals, printers and modems.

The disc control units 20 and 22, on the other hand, do not operate in full synchronism with one another because the disc memories 52, 52 with which they function operate asynchronously of one another. During fault-free operation, each disc control unit 20 and 22 writes data received from one bus 42, 44 in one memory 52 connected with it. Hence two disc memories, each connected to a different disc control unit, contain identical data. During a read operation, the system reads the stored data from one of these two memories 52 depending on which control unit 20, 22 is available and can effect the read operation in the least time, which typically means with the shortest access time. The two link controllers 32 and 34, moreover, typically are operated independently of one another.

The units 12 through 28, 32 and 34 of the processor module of FIG. 1 check for fault conditions during each information transfer. In the event a fault is detected, the unit in question is immediately disabled from driving information onto the bus structure 30. This protects the computer system from the transfer of potentially faulty information between any units. The partner of the faulty unit, however, continues operating. The system can thus detect a fault condition and continue operating without any interruption being apparent to the user. The processor module 10 provides this fault-tolerant operation by means of an improved hardware structure, rather than relying extensively on the operating system or other software control.

The peripheral control units 20, 22, 24, 26, 28, 32, 35 in the illustrated computer system transfer information to other units with an operating sequence that checks for a fault prior to driving the information onto the bus structure 30. In the event of a fault, the faulty unit is inhibited from driving information on to the bus. Operation continues, however, with the non-faulty partner unit alone driving the information onto the bus structure.

With respect to the memory and central processing units it is more timewise efficient, to proceed with information transfers without any delay for fault checking. Accordingly, the illustrated central processing units 12 and 14 and illustrated memory units 16 and 18 operate with a sequence in which information is driven onto the bus structure without delay for fault checking. The fault check is instead performed concurrently. In the event of an error-producing fault, during the next clock phase the unit in question drives onto the bus structure a signal instructing all units of the module to disregard the item of information which was placed on the bus structure during the preceding clock phase. The module then repeats the information driving clock phase using only the good partner unit, i.e., the one free of detected faults. The repeat operation aborts the subsequent transfer cycle which would otherwise have driven data onto the bus structure during this subsequent clock phase; that subsequent cycle must be repeated in its entirety.

The processor system 10 of FIG. 1 thus operates in a manner in which a data transfer from any peripheral control units is delayed for one clock phase to provide for a fault-checking step, whereas transfers from the CPU or memory proceed without such delay and are cancelled in the event of a fault detection. In either of the foregoing instances, after completion of an information transfer during which a fault condition was detected, the potentially faulty unit remains isolated from driving information onto the A bus or the B bus, and the partner of the faulty unit continues operating.

Module Organization

FIG. 1 shows a main memory unit 16, having a random access memory (RAM) that is divided into two RAM sections 16a and 16b. A transceiver 16c is connected with the A bus 42 and the X bus 46 and an identical transceiver 16d is connected with the B bus 44 and the X bus 46. A format section 16e of multiplex, ECC and compare circuitry in the memory unit couples either the A bus or the B bus with the RAM sections 16a and 16b for each memory write operation. During a read operation the unit drives data read from the RAM sections onto both buses 42 and 44. Partner memory unit 18 is constructed identically to unit 16.

An error checking and correcting (ECC) portion of the memory unit section 16e provides an error checking code on every word written into the RAM sections 16a and 16b and checks the code during each memory read operation. Depending on the syndrome of the error detected in the ECC portion of the section 16e, the memory unit raises a fault signal that is sent to all units of the module 10. More particularly, the faulty memory unit asserts both Bus Error signals. Depending on status set in that memory unit, it either corrects the data and re-transmits it on the A and B buses, or goes off-line. The partner memory unit, if present, responds to the Bus Error signals and re-transmits the correct data.

The illustrated memory unit 16 is configured with either 32 Mbytes in 8 Mbyte leaves or 8 Mbytes of random access memory organized in 2 Mbyte leaves, four-way interleaved. Each leaf is arranged for storing 72-bit words, including 64 data bits and 8 error correcting bits. Each of the illustrated RAM's 16a, 16b retain one-half of this information, i.e., RAM 16a stores 32 low-order data bits and 4 error-correcting bits, while RAM 16b stores 32 high-order data bits and 4 other error-correcting bits. Within the preferred embodiment, the memory address space is distributed among the leaves. Thus, for example, leaf #0 stores memory words 0, 4, 8, etc.; leaf #1 stores memory words 1, 5, 9, etc.; leaf #2 stores memory words 2, 6, 10, etc.; and leaf #3 stores memory words 3, 7, 11, etc. The individual bits of each memory word stored in the leaf are distributed among the array. Thus, for example, memory WORD 1 might be accessed by addressing location (0,0) of each of the chips in the array comprising leaf #1.

In addition to testing for faults within the unit, the memory unit 16 provides fault detection for the A and B buses of the module 10. For this purpose, the compare portion of the format section 16e compares all signals which the memory unit 16 receives from the A bus 42 with those the unit receives from the B bus 44. When the module 10, and particularly the buses 42 and 44, are operating without fault, the A bus and the B bus carry identical and synchronized signals. If the signals differ, the compare portion of the section 16e can note the fault. The format section 16e also tests the code of received signals and produces an error signal identifying any bus which has a coding error. The X bus 46 communicates this Bus Error signal to all units of the module 10 to instruct that each disregard the signals on that bus.

With further reference to FIG. 1, it is seen that the central processing unit 12, identical to the partner unit 14, has two processor sections 12a and 12b, a MAP 12c connected with the two processing sections to provide virtual memory operation, a control section 12d and transceivers 12e that transfer signals between the processing unit and the buses 42, 44 and 46. The two processor sections 12a and 12b are provided for purposes of fault detection within the unit 12. They operate essentially identically and in total synchronism with one another. A comparator 12f compares signals output from the two processing sections and produces a fault signal if corresponding signals from the two sections differ. In response to the fault signal, the control section, among other operations, produces an error signal that the X bus 46 transmits to all units of the module 10. The control section then isolates that unit from driving further signals onto the bus structure 30.

The error signal which the failing unit sends to other units is, in the illustrated module, a pair of signals termed an A Bus Error signal and a B Bus Error signal. Any illustrated unit in the module 10 produces this pair of signals on the X bus when it detects certain error-producing faults. Any failing unit also produces an interrupt signal that causes the central processing unit of the module to interrogate the different units to locate the faulty one.

The central processing unit 12 receives power from one of two identical bulk supplies 36a and 36b in the main power supply 36. The partner CPU 14 receives main power from the other bulk supply. Hence a failure of one bulk supply disables only one of the two partner CPUs 12 and 14, and does not impair the other. The control section 12d in the unit 12 has a power stage that produces supply voltages for the CPU 12. The power stage monitors the bus supply voltage from the main system supply 36, and monitors the further voltages it produces, to produce power fault signals. As noted, the hardware of the CPU 12 responds to any fault condition which is developed within the unit to, among other operations, disable the drivers of the transceivers 12e from sending potentially erroneous information from the unit 12 to the bus structure.

The disc control unit 20, identical to the partner disc control unit 22, has a bus interface section 20a, two identical disc control sections 20b and 20c, and a disc interface section 20d. The bus interface section 20a, which in the illustrated system is essentially standard for all control units, couples input signals from either the A bus 42 or the B bus 44, with a multiplexer, to the disc control sections 20b and 20c. It also applies output signals to the A bus and the B bus. However, prior to applying output signals to the buses, the bus interface section 20a compares output signals from the two control sections 20b and 20c and, in the event of an invalid comparison, disables output drivers in the interface section to prevent potentially erroneous signals from being applied to the bus structure 30. The disc control unit 20 receives operating power from one main bulk supply 36a and the partner unit 22 receives operating power from the other bulk supply 36b.

Each illustrated disc control section 20b and 20c has a programmed microprocessor which provides read and write operations and associated control operations for operating the disc memories 52. Two sections are provided to facilitate checking operations within the unit 20. The disc interface section 20d applies control and write data signals from the unit to the disc memories, and applies status and read data signals from the disc memories to the control sections. The disc interface section 20d tests various signals for error-producing faults with parity and comparison techniques.

With continued reference to FIG. 1, the communication control unit 24, like the identical partner 26, has a bus interface section 24a identical in large part at least to the interface section 20a of the disc unit 20. The communication unit 24 also has two communication section 24b and 24c and a communication interface section 24d. There is also a lock-step circuit 24e that brings the unit 24 into exact synchronism with the partner unit 26. The bus interface section 24a functions essentially like the bus interface section 20a of the disc control unit. In the illustrated module, the communication control section 24b serves as a drive section to provide control, address, data and status functions for the communication panels 50, and the other section serves as a check section to duplicate these operations for error checking purposes. The communication interface section 24b provides error checking functions similar to those described with regard to the disc interface section 20d of the disc control unit 20.

Similarly, the link control unit 32, which is identical to the partner unit 34, has a bus interface section 32a connected with two redundant link control sections 32b and 32c and has a link interface section 32d connected between the two control section sections and the conductor set 40a of the link 40. The partner unit 34 connects with the other conductor set 40b.

The single tape control unit 28 is constructed basically like the other control units with a bus interface section 28a connected with all three buses, 42, 44 and 46 of the bus structure 30, with two tape control sections 28b and 28c, and with a tape interface section 28d that connects with a tape transport 54.

Various digital data processor elements shown in FIG. 1, e.g., central processing and peripheral device control units, as well as bus, backplane, and power circuitry, used in a preferred practice of the invention, are commercially available from Stratus Computer Company, of Marlboro, Mass. A preferred memory unit architecture and operational sequence are discussed infra.

Bus Structure Organization

The bus structure 30 which interconnects all units of the FIG. 1 processor is connected to the units by way of a backplane which has an array of connectors, to which the units connect, mounted on a panel to which the bus conductors are wired. The backplane is thus wired with duplicated conductors of the A bus 42 and the B bus 44 and with non-duplicated conductors of the X bus 46.

The illustrated system of FIG. 1 operates in one of three bus or backplane modes; namely, obey both the A bus and the B bus, obey the A bus, or obey the B bus. In all three modes, the A bus and the B bus are driven with identical signals in lock-step synchronization, but units actuated to receive data ignore the other bus in the Obey A mode and in the Obey B mode. In all modes, parity is continually generated, and checked, and any unit may signal that either bus is potentially faulty by producing a Bus A Error signals and/or a Bus B Error signal, depending on which bus appears to have a fault. All units in the system respond to such a single Bus Error signal and switch to obey only the other bus. The central processing unit can instruct all the units simultaneously to switch operating modes by broadcasting a mode instruction.

Figure 2A:
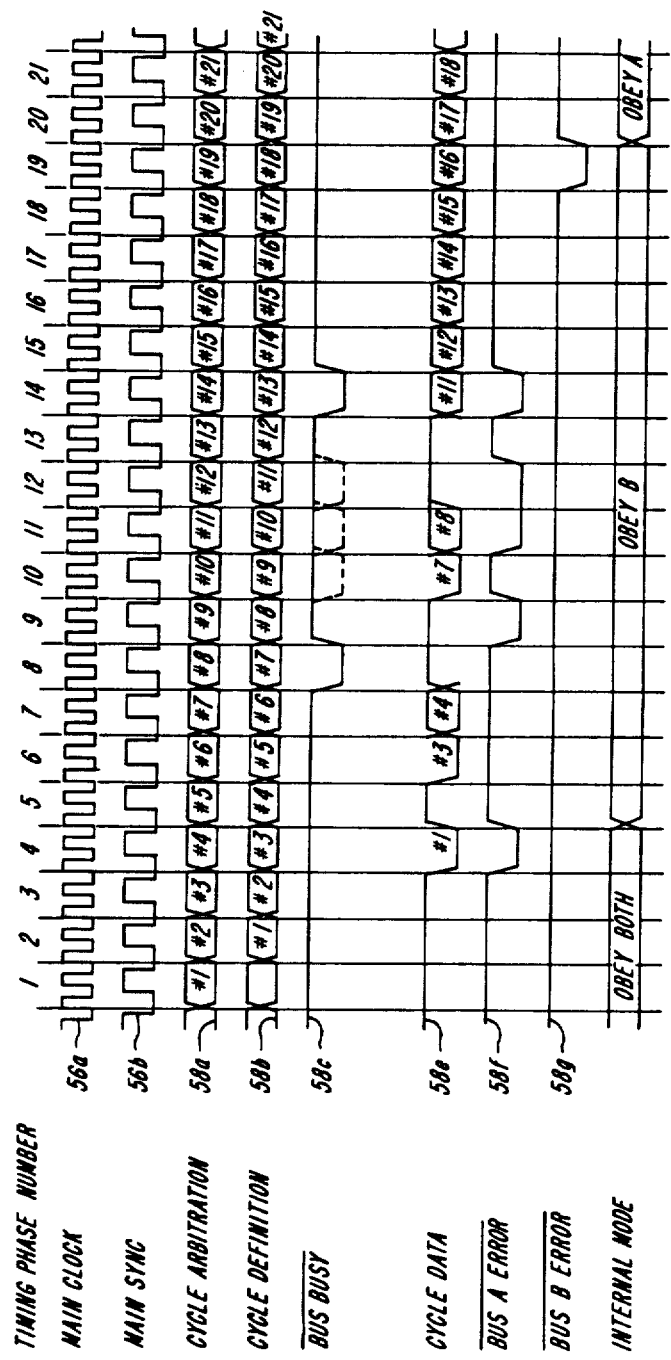
FIGS. 2A-2E depict operational timing sequences of a digital data processing apparatus and memory element operating according to a preferred practice of the invention.

The module clock 38, FIG. 1, which applies main clock signals to all units by way of the X bus 46, provides main timing for the transfer of information from one unit to another. To facilitate the production of properly phased timing sequences in different units of the module, the main clock 38 produces, as FIG. 2A shows with waveforms 56a and 56b, both clock and sync timing signals. The illustrated module operates with a sixteen megahertz clock signal and an eight megahertz sync signal and is capable of initiating a new transfer cycle on every 125 nanosecond phase of the sync signal.

Each data transfer cycle has at least four such timing phases and the illustrated system is capable of pipelining four cycles on the backplane bus structure. That is, the system is capable of concurrently performing the last phase of one cycle, the third phase of a second cycle, the second phase of still another cycle, and the first phase of a fourth cycle. The phases are termed, in the sequence in which they occur in a cycle, arbitration phase, definition phase, response phase, and data transfer phase. A cycle can be extended in the case of an error to include fifth and sixth, post-data, phases. These timing phases of an operating cycle are discussed further after a description of the signals that can occur on the bus structure during each phase.

The illustrated processor module of FIG. 1 can produce the following signals on the bus structure 30 in connection with each timing phase designated. Signals which are noted as duplicated are produced on both the A bus and the B bus; other signals are produced only on the X bus.

Arbitration Phase Signals (Duplicated)

Bus Cycle request—Any unit which is ready to initiate a bus cycle can assert this signal. The unit which succeeds in gaining bus access in the arbitration phase starts a cycle during the next phase. The central processing unit has lowest priority for arbitration and frees the next timing phase following assertion of this signal to whatever peripheral control unit that secures access in the arbitration phase.

Arbitration Network—This set of signals interconnects arbitration circuits in the different units of the system for determining the unit with the highest priority which is requesting service, i.e., which is producing a Bus Cycle request. The selected unit is termed the bus master for that cycle.

Definition Phase Signals (Duplicated)

Cycle Definition—The unit designated bus master in the arbitration phase asserts this set of signals to define the cycle, e.g., read, write, I/O, interrupt acknowledge.

Address—The bus master unit asserts the physical address signals identifying the memory or I/O location for the cycle.

Address Parity—The bus master unit also produces a signal to provide even parity of the address and cycle definition signals.

Fast Busy—An addressed slave unit can assert this optional signal to which the central processing unit responds. This signal is followed by a Busy signal during the following Response phase.

Response Phase Signals

Busy—Any unit in a system can assert this signal. It aborts whatever cycle is in the response phase.

Data Transfer Phase Signals (Duplicated)

Data—The data signals, preferably thirty-two in number, are asserted by the Bus Master unit during a write cycle or by a slave unit during a read cycle.

Upper Data Valid (UDV) and Lower Data Valid (LDV)—These signals contain encoded information indicating which bytes of the data word are valid.

Data Parity—This signal provides even parity for the data, UDV and LDV lines of the bus structure.

Fast ECC Error—A slave unit asserts this signal during a read operation, with the data, to signal the Bus Master of a correctable memory error. It is followed by both Bus Error signals in a post-data phase. Slow master units such as a disc control unit may ignore this signal and merely respond to the ensuing Bus Error signals.

Miscellaneous Duplicated Signals

Bus Interrupt Request—A unit requiring service asserts this signal to interrupt the central processor.

Miscellaneous Non-Duplicated Signals

Bus A Error—A unit which detects an error on the A bus asserts this signal during the next timing phase. The signal is asserted together with the Bus B Error signal following the transmission of faulty data on the bus resulting from an ECC memory error.

Bus B Error—A unit which detects an error on the B bus asserts this signal during the next timing phase. The signal is asserted together with the Bus A Error signal following the transmission of faulty data on the bus resulting from an ECC memory error.

Bus Clock and Bus Synchronization—The system clock 38 produces these master timing signals.

Maintenance Request—A unit requiring a low priority maintenance service asserts this signal. It is usually accompanied by turning on an indicator light on that unit.

Slot Number—These signals are not applied to the bus structure but, in effect, are produced at the backplane connectors to identify the number and the arbitration priority assigned each unit of the processor module.

Partner Communication—These signals are bused only between partner units.

Bulk Power—These are the electrical power lines (including returns) which the bus structure carries from the bulk power supplies 36a and 36b to different units of the module 10.

Cycle Phases

During an arbitration Phase, any unit of the processor module 10 of FIG. 1 which is capable of being a bus master and which is ready to initiate a bus cycle, arbitrates for use of the bus structure. The unit does this by asserting the Bus Cycle Request signal and by simultaneously checking, by way of an arbitration network described below, for units of higher priority which also are asserting a Bus Cycle Request. In the illustrated system of FIG. 1, the arbitration network operates with the unit slot number, and priority is assigned according to slot positions. The unit, or pair of partnered units, which succeeds in gaining access to the bus structure during the arbitration phase is termed the bus master and starts a transfer cycle during the next clock phase.

The central processing unit, 12, 14 in the illustrated system has the lowest priority and does not connect to the arbitration lines of the bus structure. The CPU accordingly does not start a cycle following an arbitration phase, i.e., a timing phase in which a Bus Cycle Request has been asserted. It instead releases the bus structure to the bus master, i.e., to the successful peripheral unit. Further, in the illustrated system, each memory unit 16, 18 is never a master and does not arbitrate.

During the definition phase of a cycle, the unit which is determined to be the bus master for the cycle defines the type of cycle by producing a set of cycle definition or function signals. The bus master also asserts the address signals and places on the address parity line even parity for the address and function signals. All units of the processor module, regardless of their internal operating state, also receive the signals on the bus conductors which carry the function and address signals, although peripheral control units can operate without receiving parity signals.

During the response phase, any addressed unit of the system which is busy may assert the Busy signal to abort the cycle. A memory unit, for example, can assert a Bus Busy signal if addressed when busy or during a refresh cycle. A Bus Error signal asserted during the response phase will abort the cycle, as the error may have been with the address given during the definition phase of the cycle.

Data is transferred on both the A bus and the B bus during the data transfer phase for both read and write cycles. This enables the system to pipeline a mixture of read cycles and write cycles on the bus structure without recourse to re-arbitration for use of the data lines and without having to tag data as to the source unit or the destination unit.

Full word transfers are accompanied by assertion of both UDV and LDV (upper and lower data valid) signals. Half word or byte transfers are defined as transfers accompanies by assertion of only one of these valid signals. Write transfers can be aborted late in the cycle by the bus master by merely asserting neither valid signal. Slave units, which are being read, must assert the valid signals with the data. The valid signals are included in computing bus data parity.

Errors detected during the data transfer phase will cause the unit which detects the error to assert one or both of the Bus Error signals in the next timing phase, which is the post-data phase. In the illustrated module of FIG. 1, the peripheral control units wait to see if an error occurs before using data. The central processing unit and the main memory unit of the system, however, use data as soon as it is received and in the event of an error, in effect, back up and wait for correct data. The assertion of a Bus Error signal during the post-data phase causes the transfer phase to be repeated during the next, sixth, phase of the transfer cycle. This aborts the cycle, if any, that would otherwise have transmitted data on the bus structure during this second post-data phase.

The normal backplane mode of operation of the illustrated system is when all units are in the Obey Both mode, in which both the A bus and the B bus appear to be free of error. In response to an error on the A bus, for example, all units synchronously switch to the Obey B mode. The illustrated processor module 10 returns to the Obey Both mode of operation by means of an instruction executed by supervisor software running in the central processing unit.

In both the Obey B and the Obey A modes of operation, both the A bus and the B bus are driven by the system units and all units still perform full error checking. The only difference from operation in the Obey Both mode is that the units merely log further errors on the one bus that is not being obeyed, without requiring data to be repeated and without aborting any cycles. A Bus Error signal however on the obeyed bus is handled as above and causes all units to switch to obey the other bus.

As stated, the FIG. 1 power supply 36 provides electrical operating power to all units of the system from the two bulk supplies 36a and 36b. In the illustrated system, one bulk supply provides operating power only to all even slot positions and the other provides power only to all odd slot positions. Thus in a fully redundant system according to the invention, a failure of one bulk supply 36a, 36b only stops operation of half the system; the other half remains operative.

Pipeline Phases

FIG. 2A illustrates the foregoing operation with four pipelined multiple-phase transfer cycles on the bus structure for the FIG. 1 module 10. Waveforms 56a and 56b show the master clock and master synchronization signals which the FIG. 1 clock 38 applies to the X bus 46, for twenty-one successive timing phases numbered (1) to (21) as labeled at the top of the drawing. The arbitration signals on the bus structure, represented with wave forms 58a, change at the start of each timing phase to initiate, in each of the twenty-one illustrated phases, arbitration for a new cycle as noted with the cycle numbering legend #1, #2, #3 ... #21. FIG. 2A also represents the cycle definition signals with waveform 58b. The cycle definition signals for each cycle occur one clock phase later than the arbitration signals for that cycle, as noted with the cycle numbers on the wave form 58b. The drawing further represents the Busy, Data, A Bus Error, and B Bus Error signals. The bottom row of the drawing indicates the backplane mode in which the system is operating and shows transitions between different modes.

With further reference to FIG. 2A, during timing phase number (1), the module 10 produces the cycle arbitration signals for cycle #1. The system is operating in the Obey Both mode as designated. The Bus Master unit determined during the cycle arbitration of phase (1) defines the cycle to be performed during timing phase (2), as designated with the legend #1 on the cycle definition signal waveform 58b. Also in timing phase (2), the arbitration for a second cycle, cycle #2, is performed.

During timing phase (3) there is no response signal on the bus structure for cycle #1, which indicates that this cycle is ready to proceed with a data transfer as occurs during timing phase (4) and as designated with the #1 legend on the data waveform 58e. Also during timing phase (3), the cycle definition for cycle #2 is performed and arbitration for a further cycle #3 is performed.

In timing phase (4), the data for cycle #1 is transferred, and the definition for cycle #3 is performed. Also, a Bus A Error is asserted during this timing phase as designated with waveform 58f. The error signal aborts cycle #2 and switches all units in the module to the Obey B mode.

The Bus A Error signal of timing phase (4) indicates that in the prior timing phase (3) at least one unit of the system detected an error regarding signals from the A bus 42. The error occurred when no data was on the bus structure, as indicated by the absence of data in waveform 58e during timing phase (3), and there hence is not need to repeat a data transfer.

During timing phase (5), with the system operating in the Obey B mode, a fifth cycle is arbitrated, the function for cycle #4 is defined and no response signal is present on the bus structure for cycle #3. Accordingly that cycle proceeds to transfer data during time phase (6), as FIG. 2A designates.

A new cycle #7 is arbitrated in timing phase (7) and the definition operation proceeds for cycle #6. In time phase (8), a Busy signal is asserted. This signal is part of the response for cycle #6 and aborts that cycle.

The arbitration and definition operations in time phase (9) follow the same pattern but another Bus A Error is asserted. The system already is operating in the Obey B mode and accordingly the response to this signal is simply to log the error.

Further Bus A Error signals occurring during time phases (11), (12) and (14) again have no effect on the system other than to be logged, because the system is already operating in the Obey B mode.

Cycle #12 is aborted by the Busy signal asserted during time phase (14). Data for cycle #11 is transferred in the normal sequence during time phase (14). Further, the data transfer for cycle #14 occurs in time phase (17).

In time phase (19), immediately following the cycle #15 data transfer of time phase (18), a Bus B Error is asserted. This error signal aborts cycle #17, which is in the response phase, and initiates a repeat of the data transfer for cycle #15. The repeat transfer occurs during cycle #20. Further, this error signal switches the module to the Obey A mode.

Control logic in each unit of the FIG. 1 processor 10 provides the operations in that unit for executing the foregoing bus protocol which FIG. 2A illustrates. The protocol which control logic in each peripheral control unit includes conditions the unit, when first turned on, to receive signals on both the A bus 42 and the B bus 44 and to process the two sets of signals as if they are identical. Each illustrated central processor unit and memory unit, which process signals received from a single one of the duplicated buses, initially receives signals on the A bus 42, but operates as if the signals on the B bus 44 are identical. Further, the control logic in all units initially conditions the unit to transmit signals identically on both the A and the B buses, in lock-step synchronism.

The control logic in each illustrated peripheral control unit responds to the A bus error signal and to the B bus error, transmitted on the X bus 46, to condition the unit for the following operation. A Bus Error signal for the A (or B) bus causes the unit, and hence all units in a processor module, to stop receiving on both buses and to receive only on the other bus, i.e. the B (or A) bus, commencing with the first timing interval following the one in which the Bus Error signal first appears on the X bus. The units continue however to transmit signals on both the A and the B buses.

After a peripheral control unit has responded to an A (or B) Bus Error signal by switching to receiving on only the B (or A) bus, the control logic therein does not again switch in response to further Bus Error signals for the A (or B) bus; it essentially ignores the further error signals. However, the control logic responds to a B (or A) Bus Error signal by switching the unit to receive on the A (or B) bus, and it then ignores further B (or A) Bus Error signals.

In the illustrated module, faulty information is transmitted on the A and/or B buses generally only by the central processing unit and by the memory unit. This is because the illustrated peripheral control units check for faults prior to transmitting information on the A and B buses. If a fault is detected, the control unit in question does not transmit information, and only the partner unit does.

Further, each unit applies address and data signals on the A and B buses with parity which that unit generates. The memory unit serves, in the illustrated embodiment, to check bus parity and to drive the appropriate bus error line of the X bus 46 during the timing interval immediately following the interval in which it detected the bus parity error. The memory unit also sets a diagnostic flag and requests a diagnostic interrupt.

All units of a module which arbitrate for access to the bus structure, as discussed further in the next section, include logic that checks for false operation of the bus arbitration logic and that drives the appropriate bus error line—in the event of such a fault—on the interval following the detection of the fault. The unit also sets a diagnostic flag and requests a diagnostic interrupt.

The bus protocol which control logic in each unit provides further conditions that unit to provide the following operation in response to a Bus Error signal for the bus which the unit is presently conditioned to receive. (These operations do not occur for a Bus Error signal for a bus which is not being received; as noted the unit essentially ignores such an error signal.) A unit which was transmitting cycle definition signals during the interval immediately preceding the one in which the Bus Error signal appears on the X bus re-initiates that cycle, including arbitration for the bus, if that cycle continues to be needed. This is because the Error signal causes any unit receiving the cycle definition signals to abort that cycle.

A unit which was transmitting data signals during the timing interval immediately preceding the one in which the Bus Error signal appears on the bus repeats the data transmission two intervals after it was previously sent, i.e. on the interval following the one in which the Error Signal appears on the bus.

A unit receiving definition data signals for a cycle and which is identified (addressed) by such signals responds to the Bus Error during the next interval by aborting that cycle.

A unit which was receiving data signals during the interval immediately preceding the one in which the Bus Error signal appears on the bus ignores that data and receives a re-transmission of that data two intervals after the ignored one. An alternative is for the unit to receive and latch the data from both buses and use only the data from the good bus.

When a unit simultaneously receives Bus Error signals for both the A and the B buses, which indicates a memory ECC error, the unit responds exactly as it does to a Bus Error signal for a single bus being received, as discussed above, except that it does not make any change in the bus(es) to which it is responding. Thus an ECC error aborts any cycle that was placing cycle definition signals on the bus in the preceding interval, and it causes any data transfer in that preceding interval to be repeated in the next interval following the ECC error.

As FIG. 2A illustrates, the occurrence of a Busy signal aborts a cycle that was placing definition signals on the bus in the preceding interval.

Control logic for implementing the foregoing bus protocol and related operations in the several units of a processor module for practice of this invention can be provided using conventional skills, and is not described further, other than as noted.

Figure 2B:
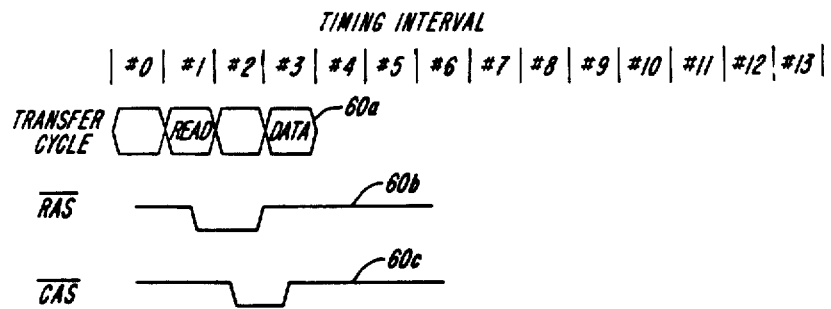

FIG. 2B illustrates a timing sequence for a READ operation of exemplary memory unit 16. As indicated by phase line 60a, an executing transfer cycle transmits definition signals defining the READ cycle in timing interval #1. Wave form 60b shows that during the latter half of timing interval #1, and continuing into timing interval #2, the memory unit strobes a memory chip array, i.e., a leaf, with a row address signal (RAS), causing row data to be transferred into temporary latches on each chip. During the latter half of timing interval #2, and continuing into timing interval #3, the memory unit strobes a column address signal (CAS), pulling the addressed word from the temporary latches; see wave form 60c. The memory unit then transmits the word on the bus structure in timing interval #3, as indicated by phase line 60a. Simultaneously, the format section 16e of the memory unit checks the data for error. In the event the data is erroneous, the memory unit asserts a BUS ERROR signal in timing interval #4 and transmits new data in timing interval #5.

Figure 2C:
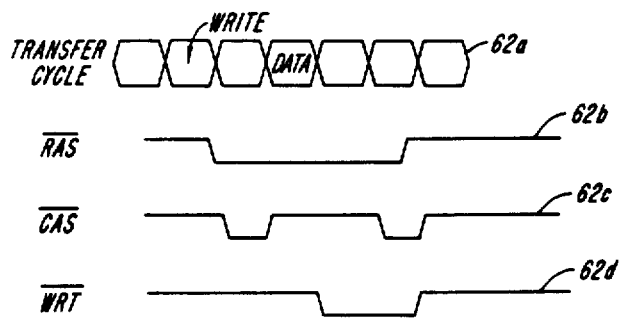

The illustrated memory unit 16 executes a WRITE operation according to the sequence shown in FIG. 2C. As indicated by phase line 62a, an executing transfer cycle defines a WRITE operation, including addressing information, during timing interval #1. Wave form 62b shows that the unit asserts RAS in the latter portion of timing interval #1 and proceeding through timing interval #5. The memory unit asserts, CAS in timing intervals #2 and #5, as shown by wave form 62c. According to wave form 62d, the memory units asserts a write signal, WRT, in timing intervals #4 and #5. The concurrent assertion of CAS and WRT in timing interval #5 causes data applied from the bus during timing interval #3 to be stored at the address defined in the definition phase. In the event a BUS ERROR signal is received in timing interval #4, indicating that the data received in timing interval #3 was incorrect, the WRT signal and later CAS signal are delayed for two timing intervals. Similarly, RAS remains asserted for two additional intervals.

Figure 2D:
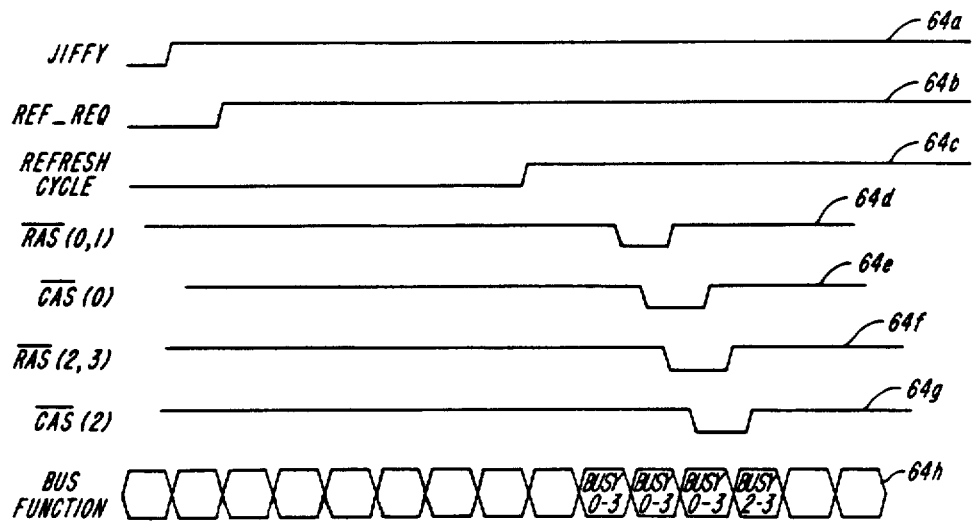

FIG. 2D illustrates a timing sequence for a REFRESH cycle utilized in exemplary memory unit 16. As indicated by wave form 64a, a memory unit gate array (discussed below in conjunction with FIG. 5) asserts a JIFFY signal in timing interval #1. This signal indicates the necessity of refreshing at least a portion—typically a row—of the memory leaves. In response to this signal, a refresh request signal REF_REQ is asserted one cycle later, i.e., in timing interval #2; see wave form 64a. At this time, the refresh circuitry begins testing the backplane to determine when the refresh conditions are satisfied. These conditions are:

(i) that none of the memory leaves are being addressed by a currently executing transfer cycle, (ii) that leaves #0 and #1 are not currently being read, and (iii) that leaves #0, #1, #2, and #3 are not currently being written.

When the above conditions are satisfied, the refresh circuitry commences a refresh of the leaves. In the event these conditions are not satisfied within 7.25 microseconds, the refresh circuitry inhibits further memory access, thereby allowing refreshing to occur.

In the illustration, the refresh cycle is indicated by wave form 64c, beginning in timing interval #8. Two timing intervals alter the refresh begins, the memory unit strobes leaves #0 and #1 with RAS, as indicated by wave form 64d. The content of a word stored in one of the leaves, e.g., leaf #0, is checked for error by strobing that leaf with CAS in the following timing interval, i.e., in timing interval #10; see wave form 64e. As further indicated by timing lines 64f and 64g, in timing intervals #11 and #12, the memory unit strobes leaves #2 and #3, while simultaneously error-checking a word from leaf #2. The row address for refresh is determined by a refresh address latch in the memory array, discussed infra. Error checking is carried out by formal section 16e as described below.

To avoid conflict with transfers from other functional units, the memory unit asserts a BUSY signal in response to any attempt to address the memory leaves during the refresh cycle. According to phase line 64h, a BUSY signal is asserted in response to any attempt to address memory leaves #0–#3 during timing intervals #9–#11. A BUSY signal is also asserted in response to an attempt to address leaves #2 or #3 in timing interval #12. Thereafter, the all leaves are available for access by the system.

A memory unit operating according with the illustrated refresh timing cycles is capable of refreshing all of the memory locations in every 512×512 bit memory chip in the unit every four milliseconds. Such a unit is further capable of checking the memory for errors at the rate of one Mbyte per second. Within 32 seconds, the illustrated refresh mechanism is capable of refreshing and error-checking an entire 32 Mbyte memory board.

Figure 2E:
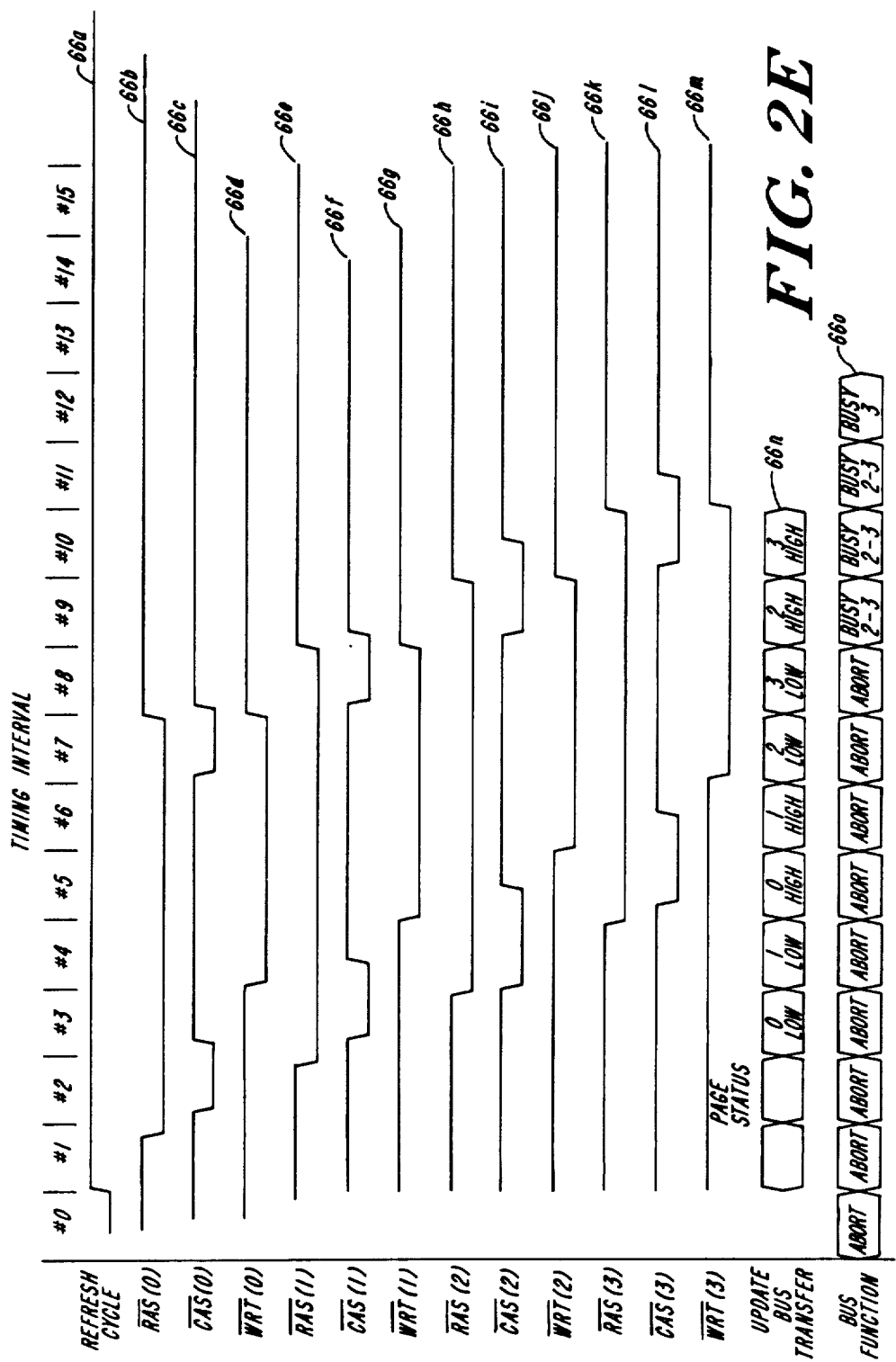

FIG. 2E illustrates a timing sequence for a preferred memory unit update cycle executed according to a preferred practice of the invention. The sequence is executed by the partnered memory units of a duplicative pair when one of the units requires a memory content transfer from the other unit. This event typically occurs when a new memory unit, which replaces a prior faulty unit, requires loading in order to duplicate the original contents of the non-faulty memory unit.

The illustrated update cycle is an extension of the refresh cycle normally executed by the memory unit. That is, the illustrated update cycle serves not only to refresh and error-check the chips at the address identified by the refresh latch, but also to transfer one word of information from each leaf of the original unit to corresponding locations in the new unit. Moreover, the sequence is executed without intervention of the central processor units. Timing for the sequence is determined—as with the refresh cycle—by the assertion of a JIFFY signal and concurrence of the refresh conditions.

As indicated by wave form 66a, a refresh cycle signal is asserted in timing interval #1 in response to prior assertion of a JIFFY signal and concurrence of the conditions set forth above. In the latter portion of timing interval #1, the update circuitry asserts RAS to strobe leaf #0; see wave form 66b. RAS remains asserted through timing interval #7. As indicated by wave form 66c, the memory unit strobes leaf #0 with CAS in timing interval #2, causing the data stored in that leaf to be placed on the buses A and B during timing interval #3. While CAS is strobed in both the original and the new memory units, non-assertion of an ONLINE flag associated with the new unit prevents that unit from asserting any data onto the bus during this period. Upon placement and initialization of the replacement memory board in the system 10, the operating system orders the memory board pair, i.e., the old, non-faulty and replacement boards, to begin the update process. The memory unit strobes leaf #0 with WRT during timing intervals #4 through #7, while strobing CAS in timing interval #7 to place bus data back into leaf #0, of both memory units; see wave form 66d.

As indicated by timing lines 66e–66g, the memory unit executes a similar sequence of RAS, CAS, and WRT to cause a word from leaf #1 of the original, non-faulty memory unit to be written to the new memory unit. Timing lines 66h–66j and 66k–66m illustrate like sequences for updating leaves #2 and #3.

The transfer of data associated with the illustrated UPDATE cycle is illustrated by phase line 66n. Initially, in timing interval #2, the memory unit transfers a page status signal. This four-bit signal includes a one-bit flag indicating whether the page from which the transferred data is derived has been accessed, a one-bit flag indicating whether that page has been modified, and a two-bit code having values indicating whether the page is accessible, writeable, a test page, or a normal page. Thereafter, according to a illustrated embodiment, utilizing 72-bit memory words and a 32-bit data bus, in timing interval #3, the low order 32-bits of an update word from leaf #0 are transferred on the bus. The remainder of that word is transferred two timing intervals later, i.e., in timing interval #5. Interleaved with the transfer of information for leaf #0, is the transfer of information for leaf #1. To wit, the low-order bits of a word from leaf #1 are transferred during timing interval #4, while the high-order bits are transferred during timing interval #6. Similarly, the transfer of information from leaves #2 and #3 are interleaved during timing intervals #7–#10, as indicated.

In the event of a bus error during the update cycle, the memory unit retransmits the sequence beginning with the word portion indicated on faulty. Thus for example, if a Bus error is asserted in timing interval #6, indicating a potential error in the prior transfer of the high order bytes of a word from leaf #0, the update circuitry will re-transmit these bytes in timing interval #7. The remaining transfer sequence, including the once-transmitted high order bytes from leaf #1, will be transmitted beginning in timing interval #8 and proceeding through timing interval #12.

Circuitry for implementing the aforementioned refresh and update cycles may be constructed utilizing the above timing diagrams with conventional memory design techniques.

In order to prevent other units of the date processing system from interfering with the update information transfer, the memory units ties the bus by asserting BUSY signals during the UPDATE cycle. The actions of the memory unit in this regard are illustrated by phase line 66o. Specifically, the memory unit prevents any other unit from utilizing the bus during timing intervals #0-#8, by asserting successive ABORT signals. Operationally, these are non-specific BUSY signals, i.e., they are asserted regardless of which functional unit is addressed in a definition phase. During timing intervals #9 and #10, the memory unit asserts a BUSY signal in response to an attempt to address memory leaves #2 or #3. Further, in timing interval #12, the memory unit asserts a BUSY signal in response to any attempt to address memory leaf #3.

A memory unit operating with the illustrated Update timing sequence is capable of transferring 32 Mbytes of information between memory units in eight seconds, real time, regardless of system demand. This is to be distinguished from prior update mechanisms, discussed above, which required 16 seconds of central processor time, taking up to 30 minutes, real time, on a busy system.

Memory Unit

Figure 3:
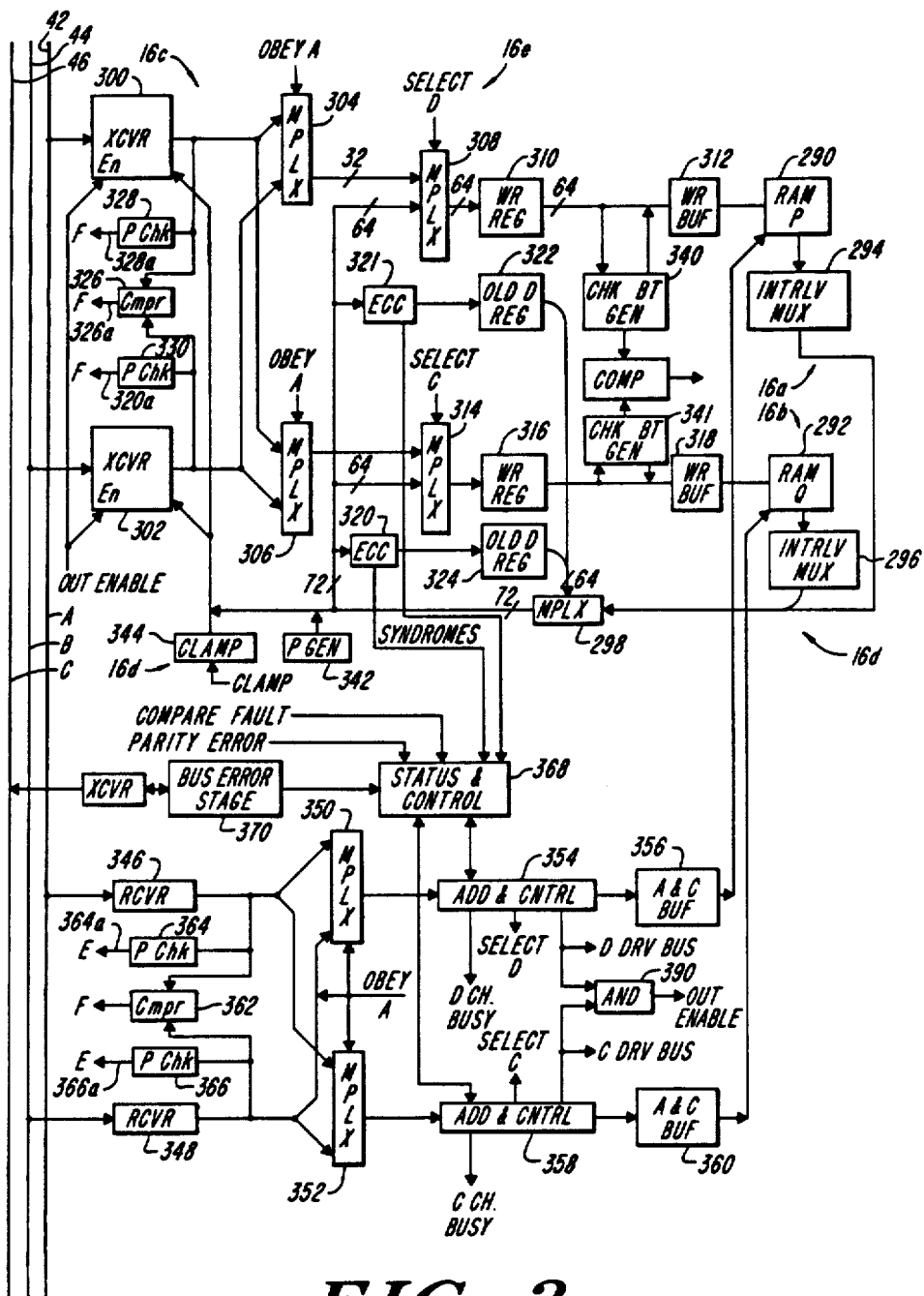
FIG. 3 depicts the structure of a main memory unit constructed according to a preferred practice of the invention.

FIG. 3 shows a main memory unit 16 of the FIG. 1 processor module 10. The partner memory unit 18 is identical and operates in lock-step synchronism with unit 16. The memory sections 16a and 16b (FIG. 1) of the illustrated memory unit employ identical random access memories (RAMs) 290 and 292, respectively. Each is illustratively a four-way interleaved dynamic RAM array capable of writing repeatedly to the same leaf once every five timing phases (FIGS. 2A and 2C) and of reading repeatedly from the same leaf once every two timing phases. The RAM 290 stores the upper half-word of a 64-bit data word and the RAM 292 stores the lower half-word of a 64-bit data word. Each RAM applies a half-word of read data through an interleave multiplexer 294, 296, respectively, and the combined output half-words of a read word are applied to an output multiplexer 298. The output from this multiplexor is applied to the A bus 42 by way of an A bus transceiver 300 and is applied to the B bus 44 through a B bus transceiver 302. The multiplexors 294, 296 and 298 are part of the memory unit format section 16e, FIG. 1, which includes address and control circuits 16f shown in the lower part of FIG. 3.

Each transceiver 300, 302 can apply different half-words of write data received from the associated bus to each of two write multiplexors 304, 306 to write the upper half-word of a data word in the RAM 290 by way of a data channel which has a further multiplexor 308, a write register 310 and a write buffer 312, and to write the lower half-word of the same data word in the RAM 292 by way of a like data channel that has a further multiplexor 314, a write register 316 and a write buffer 318. The two write multiplexors 304, 306, in the illustrated embodiment select data from a single transceiver 300, 302, and hence form either the A bus or the B bus. Information received during a 64-bit write cycle, as defined by the cycle's definition phase, is received in 32-bit portions during the two halves of the data transfer phase.

As further shown in FIG. 3, read data from the RAMs 290, 292 is applied to an error checking and correcting (ECC) stages 320 and 321. The ECC stages apply the read data word to the old data registers 322 and 324, as shown. Read data from RAMs 290, 292 is also applied to channel multiplexors 308 and 314. The two old data registers are connected to apply the data word stored in each to the multiplexor 298 for application to both the A bus and the B bus by way of the transceivers 300, 302. If the illustrated memory unit 16 is executing a 64-bit read cycle, as defined in the definition phase, 32-bit halves of the read word are applied to the bus structure in each half of the data transfer phase.

A parity checking circuit 328 is connected to check the parity of the write data output from the transceiver 300, and a like parity check circuit 330 is connected with the write data output from the transceiver 302.

A check bit generators 340 and 341 are connected to insert further check bits to the write data half-words applied to the write buffers 312 and 318. There is also a parity generator 342 connected to introduce a parity bit to each read data word output from the multiplexor 298 to the transceivers 300, 302.

The format section 16e of the illustrated memory unit further includes a comparator 326 connected to compare the data words output from the transceivers 300, 302 to the half-word multiplexors 304, 306. An invalid comparison raises a fault status, which can be processed as desired. A clamp circuit 344, preferably identical in design and operation to the clamp circuits 88 and 90 in each central processing unit shown in FIG. 3, is connected to selectively ground the read data lines which feed to the transceivers 300, 302.

It will thus be seen that the illustrated memory unit is in effect arranged with two identical read/write portions, each of which processes a 32-bit half-word of a given data word. Each such portion includes one transceiver 300, 302, one bus select multiplexor 304, 306, one channel multiplexor 308, 314; and one write register, write buffer, and RAM.

With further reference to FIG. 3, the address and control circuits 16f of the memory unit are similarly arranged in two portions, each of which operates with one RAM 290, 292. Receivers 346 and 348 connect with the address and function conductors of the A bus 42 and of the B bus 44, respectively, and are connected with channel multiplexors 350, 352 to select the signals from one receiver and correspondingly from one bus. An address and control stage 354 receives the signals from the multiplexor 350 and applies them to an address and control buffer 356 that operates the RAM 290. Similarly, an address and control stage 358 receives signals from the multiplexor 352 for producing signals which are applied by way of an address and control buffer 360 to operate the other RAM 292. The stages 354 and 358 produce, respectively, a Select D signal and a Select C signal which control the channel multiplexors 308 and 314. Each multiplexor is set to select input signals either from the bus structure or from the ECC stage 320, depending on the source of each half-word being written in a memory section.

A comparator 362 is connected to compare the address and control signals output from the two receivers 346 and 348, i.e., on the two buses 42 and 44. In response to an invalid comparison, this comparator, like the data comparator 326, produces a fault signal.

Parity check circuit 364 and 366 are connected with the output lines from the receivers 346 and 348, respectively. The data parity check circuit 328 and the address parity check circuit 364 test the parity of signals on the A bus 42 for all data transfer operations of the processor module 10. The parity check circuits 330 and 366 provide the same function with regard to signals on the B bus 44. Note that address parity is separate from data parity inasmuch as address signals, including function or cycle definition, and data signals occur at different phases of a cycle. In each phase each set of bus conductors has its own parity, which is tested.

The illustrated memory unit 16 also has a status and control stage 368 which is not duplicated. The stage receives the parity error signals, the comparator fault signals, and ECC syndrome signals from the ECC stages 320 and 321. The stage 368 connects to numerous other elements in the memory unit, with connections which are in large part omitted for clarity of illustration. A bus error stage 370 is connected with the stage 368 and, by way a transceiver, with conductors of the X bus 46 as described below with reference to FIG. 4.

With this arrangement shown in FIG. 3, the memory unit 16 can operation without a partner unit 18 (FIG. 1) and still detect and correct for a single failure in an integrated circuit chip of the RAMs 290, 292. Moreover, the unit 16 with a partner unit 18 is able to detect a high percentage of single component failures and to continue functioning by disabling the failing memory unit 16, 18. Further, it is the memory unit 16, 18 of the FIG. 1 system that checks for errors on the bus structure 30 and signals other units of the system in the event that such an error is detected. This arrangement is deemed preferable, but other units can also be arranged to provide this operation, either in lieu of or in addition to the bus error-checking in the memory unit. The parity check circuits 328, 330, 364, and 366 and the comparators 326 and 362 test for bus faults. As will also become apparent from the following further description, the memory unit 16 can function as an I/O device which other units of the processor module 10 can address, for example to diagnose a detected fault in operation of a memory unit 16, 18.

Figure 4:
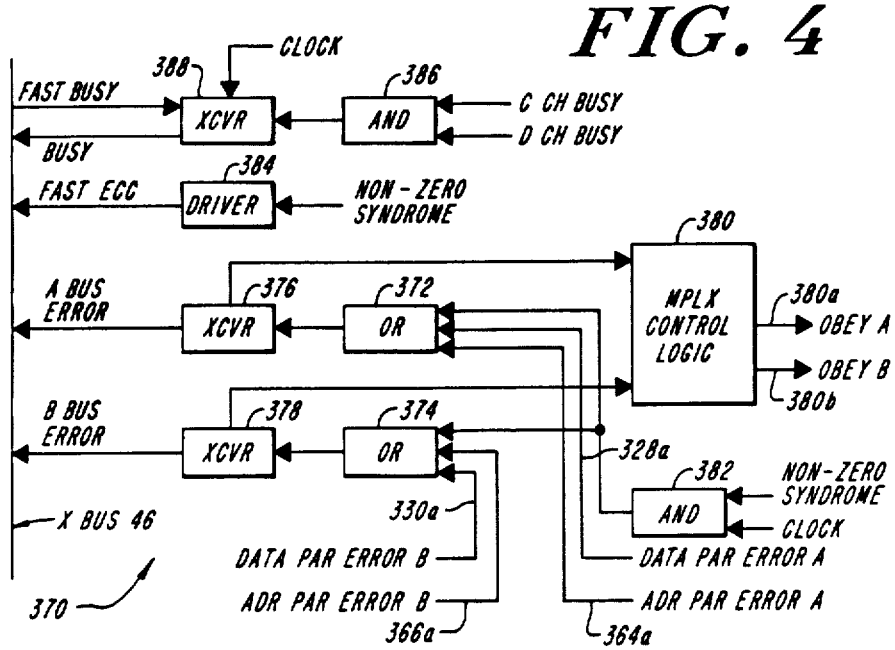
FIG. 4 depicts a preferred bus error stage for responding to parity signal errors and ECC syndrome signals.

FIG. 4 shows the bus error stage 370 of FIG. 3 which responds to parity error signals and the ECC syndrome signal of the illustrated memory unit 26. An OR gate 372 receives the Data Parity Error signal for the A bus, which the parity check circuit 328 produces on its output line 328a, and receives the Address Parity Error signal for the A bus output from the parity check circuit 364 on line 364a. Similarly, the Data Parity Error signal for the B bus, produced on line 330a, and the Address Parity Error signal for the B bus, produced on line 366a, are applied to a further OR gate 374. Either error signal for the A bus and input to the OR gate 372 actuates a transceiver 376 to produce an A Bus Error signal. This signal is applied to the X bus 46 for communication to all units in the module 10. Similarly, an error signal for the B bus and input to the OR gate 374 actuates a further transceiver 378 to produce a B Bus Error signal that is applied to the X bus 46. FIG. 2A illustrates operation of the illustrated processor module 10 when either Bus Error signal is asserted.

Each transceiver 376 and 378 is also connected with a multiplex control logic stage 380 that produces the OBEY A and OBEY B select signals for the multiplexors 304 and 306. The transceiver 376 applies the A Bus Error signal received from the bus structure, even when driven by the memory unit 16, to the logic stage 380 and the transceiver 378 likewise applies the B Bus Error signal. The logic stage 380 normally produces both OBEY signals. When it produces a single OBEY signal, and receives a Bus Error signal for the bus not being obeyed, it maintains the same single OBEY signal. However, when it produces a single OBEY signal and receives a Bus Error signal for the bus that is being obeyed, it switches to produce only the other OBEY signal.

The operation of the FIG. 3 check bit generators 340, 341 and ECC stages 320, 321 is now described in reference to an example with a 64-bit memory word consisting of two 32-bit half-words. Each data half-word which the memory unit 16 receives from the bus structure has a 32-bit length plus one parity bit, introduced for example by the parity generator 92 in a CPU section described above. The parity check circuits 328 and 330 test this parity of data applied to the memory unit 16. Only 32 data bits of each input 64-bit word are applied to each bus multiplexor 304 and 306. Each multiplexor 304 and 306 accordingly receives two 32-bit inputs, and applies the selected 32-bits to the output thereof, for a total half-word length through each bus multiplexor, channel multiplexor and write register of 32-bits.

The multiplexor 308, 314 selects 8, 16, 24, or 32 bits of new data and merges them into the required byte positions in the 64-bit word read from the RAM's via multiplexor 298. The output of multiplexor 308, 314 is thus 64 bits and is fully duplicated.

The check bit generator 340 adds to each 64-bit word, eight check bits to bring each word length to 72-bits, all of which are written in each RAM 290, 292. Thus, the illustrated memory 16 stores a 72-bit memory word for each 64-bit data world. The code with which these error checking and correcting bits are appended to each data word are set forth in the following Table I, in which the data word bits are numbered (63) through (00), and the memory check bits introduced by the check bit generator are numbered (7C) to (0C). The effectiveness of this ECC code stems in significant part from the fact that the present memory unit employs two half-word-processing portions, two half-word-storing RAMs, and controls each RAM with one of two identical address and control circuit portions. One RAM 290 stores the data bits designated 63 to 32 and the check bits 7C, C, 5C, and 4C of the following code. The other RAM stores the data bits of 31 to 00 and the check bits 3C, 2C, 1C and 0C. It is preferred that each data half-word of a memory word include the parity bit generated from the other half-word.

TABLE I

| DATA | (Check Bits Complemented) | | | | | | | |
|---|---|---|---|---|---|---|---|---|
| BIT | 7C | 6C | 5C | 4C | 3C | 2C | 1C | 0C |
| 63 | X | X | X | X | — | X | X | X |
| 62 | X | X | X | X | X | X | X | — |
| 61 | X | X | X | X | X | X | — | X |
| 60 | X | X | X | X | — | X | — | — |
| 59 | X | X | X | X | X | — | X | X |
| 58 | X | X | X | X | — | — | X | — |
| 57 | X | X | X | X | — | — | — | X |
| 56 | X | X | X | X | X | — | — | — |
| 55 | X | — | X | X | X | X | X | X |

TABLE I-continued

| DATA BIT | (Check Bits Complemented) | | | | | | | |
|---|---|---|---|---|---|---|---|---|
| | 7C | 6C | 5C | 4C | 3C | 2C | 1C | 0C |
| 54 | X | — | X | X | — | X | X | — |
| 53 | X | — | X | X | — | X | — | X |
| 52 | X | — | X | X | X | X | — | — |
| 51 | X | — | X | X | — | — | X | X |
| 50 | X | — | X | X | X | — | X | — |
| 49 | X | — | X | X | X | — | — | X |
| 48 | X | — | X | X | — | — | — | — |
| 47 | X | X | — | X | X | X | X | X |
| 46 | X | X | — | X | X | — | X | — |
| 45 | X | X | — | X | — | X | — | X |
| 44 | X | X | — | X | X | X | — | — |
| 43 | X | X | — | X | — | — | X | X |
| 42 | X | X | — | X | X | — | X | — |
| 41 | X | X | — | X | X | — | — | X |
| 40 | X | X | — | X | — | — | — | — |
| 39 | X | X | X | — | X | X | X | X |
| 38 | X | X | X | — | — | X | X | — |
| 37 | X | X | X | — | — | X | — | X |
| 36 | X | X | X | — | X | X | — | — |
| 35 | X | X | X | — | — | — | X | X |
| 34 | X | X | X | — | X | — | X | — |
| 33 | X | X | X | — | X | — | — | X |
| 32 | X | X | X | — | — | — | — | — |
| 31 | — | X | X | X | X | X | X | X |
| 30 | — | X | X | X | — | X | X | — |
| 29 | — | X | X | X | — | X | — | X |
| 28 | — | X | X | X | X | X | — | — |
| 27 | — | X | X | X | — | — | X | X |
| 26 | — | X | X | X | X | — | X | — |
| 25 | — | X | X | X | X | — | — | X |
| 24 | — | X | X | X | — | — | — | — |
| 23 | — | — | X | X | — | X | X | X |
| 22 | — | — | X | X | X | X | X | — |
| 21 | — | — | X | X | X | X | — | X |
| 20 | — | — | X | X | — | X | — | — |
| 19 | — | — | X | X | X | — | X | X |
| 18 | — | — | X | X | — | — | X | — |
| 17 | — | — | X | X | — | — | — | X |
| 16 | — | — | X | X | X | — | — | — |
| 15 | — | X | — | X | — | X | X | X |
| 14 | — | X | — | X | X | X | X | — |
| 13 | — | X | — | X | X | X | — | X |
| 12 | — | X | — | X | — | X | — | — |
| 11 | — | X | — | X | X | — | X | X |
| 10 | — | X | — | X | — | — | X | — |
| 09 | — | X | — | X | — | — | — | X |
| 08 | — | X | — | X | X | — | — | — |
| 07 | — | X | X | — | — | X | X | X |
| 06 | — | X | X | — | X | X | X | — |
| 05 | — | X | X | — | X | — | — | X |
| 04 | — | X | X | — | — | X | — | — |
| 03 | — | X | X | — | X | — | X | X |
| 02 | — | X | X | — | — | — | X | — |
| 01 | — | X | X | — | — | — | — | X |
| 00 | — | X | X | — | X | — | — | — |
| C7 | X | — | — | — | — | — | — | — |
| C6 | — | X | — | — | — | — | — | — |
| C5 | — | — | X | — | — | — | — | — |
| C4 | — | — | — | X | — | — | — | — |
| C3 | — | — | — | — | X | — | — | — |
| C2 | — | — | — | — | — | X | — | — |
| C1 | — | — | — | — | — | — | X | — |
| C0 | — | — | — | — | — | — | — | X |

When the memory unit 16 is used without a partner unit 18, this eight-bit error correcting code of Table I makes possible the correction of single RAM failures. Further, when the memory unit 16 operates with a partner unit 18, the partnered units are capable of detecting errors in each unit and of isolating either unit from driving further signals onto the bus while the other unit continues normal operation. The eight-bit error code of Table I enables the source of a single bit error to be located. The status and control stage 368 includes failure registers for storing the address of an error for subsequent accessing, and for storing the syndrome.

In the event of a non-zero syndrome, the unit 16, 18 in which it occurs can be switched to an off-line status, but leave the partner unit operating normally. A memory unit in off-line status, as implemented in the control stage 368, receives and processes diagnostic interrogation signals but does not drive signals onto the bus structure except in response to such interrogation.

Data routed through the multiplexors 304, 308, the write register 310, and the check bit generator 340 is fully duplicated and checked by a comparator 336 after the check-bit generator, as illustrated.

The illustrated memory unit detects faults in the non-duplicated portions, e.g., in the status and control stage 368 or the parity generators, by means of maintenance software. However, an error in this portion of the memory unit is not by itself likely to produce erroneous data on either the A bus or B bus.

With further reference to FIGS. 3 and 4, the syndrome signal from the ECC stages 320, 321 are applied to the status and control stage 368 as indicated. A non-zero syndrome signal actuates a driver 384 (FIG. 4) to produce a Fast ECC Error signal and apply it to the X bus 46. A non-zero syndrome signal also produces both the A Bus Error signal and the B Bus Error signal, from the transceivers 376 and 378, by enabling an AND gate 382 to respond to a selected clock signal.

The memory unit 16, as noted above, carries out the foregoing fault detection operations concurrently with memory read and write operations. In the event a fault is detected during a time phase when the memory unit is driving read data onto the bus, the non-zero syndrome signal from the ECC stage 320 causes the driver 384 of FIG. 4 to produce the Fast ECC signal during the same time phase. This signal informs the CPU 12, 14 that a memory ECC error is occurring in the current time phase. The transceivers 376 and 378 drive the A Bus Error and the B Bus Error signals, or either of them as appropriate, during the next time phase. In the second time phase after the error is detected, the memory unit can drive correct data onto the bus structure. The correct data comes from the old data registers 322 and 324, which store corrected data produced in the ECC stage 320. Alternatively, in a module having two memory units, the correct data comes from the old-data registers 322 and 324 of the nonfailing partner unit.

With further reference to FIG. 3, each address and control stage 354 and 358 can produce a Channel Busy signal and a further signal designated Channel Driving Bus. An AND gate 386 (FIG. 4) in the memory status and control stage 368 is actuated by the two Bus signals to drive a transceiver 388 to produce a Fast Busy signal and the Busy signal discussed above with reference to FIG. 2A. A further AND gate 390, FIG. 3, produces an Out Enable signal that enables the data transceivers 300 and 302 only when both Driving Bus signals are present. With this arrangement, when the two channels of the address and control circuit 168 do not concurrently produce the Driving Bus signals, the memory unit is disabled from transferring data to the bus structure, as desired to prevent potentially faulty data from being transmitted to other units of the computer system. The clamp stage 344 in a memory unit prevents potentially faulty data from being applied to the transceivers 300, 302 in the event of a power supply failure.

A memory unit having the foregoing features of FIGS. 3 and 4 can execute numerous memory cycles. In a memory read cycle, the data read from memory is applied to the bus structure 30 by way of the transceivers 300, 302 in the same time phase as it is applied to the ECC stages 320, 321. In the event this stage produces a non-zero syndrome, the memory unit produces the Fast ECC signal during the same time phase and transmits it to the central processing unit 12, 14 (FIG. 1) by way of the X bus 46. The ECC stage produces the corrected data word and stores it in the old data registers 322, 324 for feeding to the bus structure by way of the multiplexor 298 and the transceivers 300, 302 during a subsequent timing phase.

In addition to executing a conventional write operation of a full data word, the memory unit can perform a write operation with only partial data from the bus structure. For this operation, the address control portion of the memory unit does not receive both the Upper Data Valid and the Lower Data Valid signals, as occurs when a full data word is to be written, but receives only one of these control signals. In response to receiving only a single Data Valid signal, the memory unit first reads from the RAMs 290, 292 the word stored at the location being addressed, and replaces only part of that word with the new data received from the bus. During this operation, all eight ECC code bits are recomputed, in duplicated hardware, for the new 72-bit word. The memory unit thus stores a full 72-bit word, which includes the new data bytes in addition to the old data bytes with a full complement of check bits.

Another memory cycle which the memory unit 16, 18 can execute is to read a complete word from the RAMs 290, 292 and drive it onto the bus structure by way of the transceivers 300, 302 and to receive the same data from the bus structure and again write it at the same address, with a recomputing of all ECC bits. This memory operation is useful, for example, to duplicate the contents of one memory unit in a partner unit. That is, to bring one memory unit up to date with a partner memory unit, a system can read from the latter memory unit and place the resultant data on the bus structure, and write that data from the bus structure into the former memory unit at the same location. Any data read from the former memory unit is not driven onto the bus structure, by inhibiting the Output Enable signal of the transceivers 300, 302 in that memory unit. The illustrated memory unit is thus capable of writing from an on-line memory unit to an off-line memory unit in one multi-phase memory cycle.

Memory access cycles are defined by four bits on the system 10 backplane. These four bits, asserted during a definition phase, are referred to as FUNC bits and have bit positions 3, 2, 1, and 0. Utilized values of these bits, as well as the function they define, are set forth below:

TABLE II

| FUNC 1,0 | 00 | 01 | 10 | 11 |
|---|---|---|---|---|
| FUNC 3,2 | | | | |
| 00 | Idle | 16-BIT write | 16-BIT interlock | 32-BIT update |
| 01 | read | 32-BIT write | | 64-BIT |
| 10 | read | I/O (16/32-BIT) write | read | I/O (16-BIT) write |
| 11 | read | write | int/ack | (diagnostic) |

Figure 5:
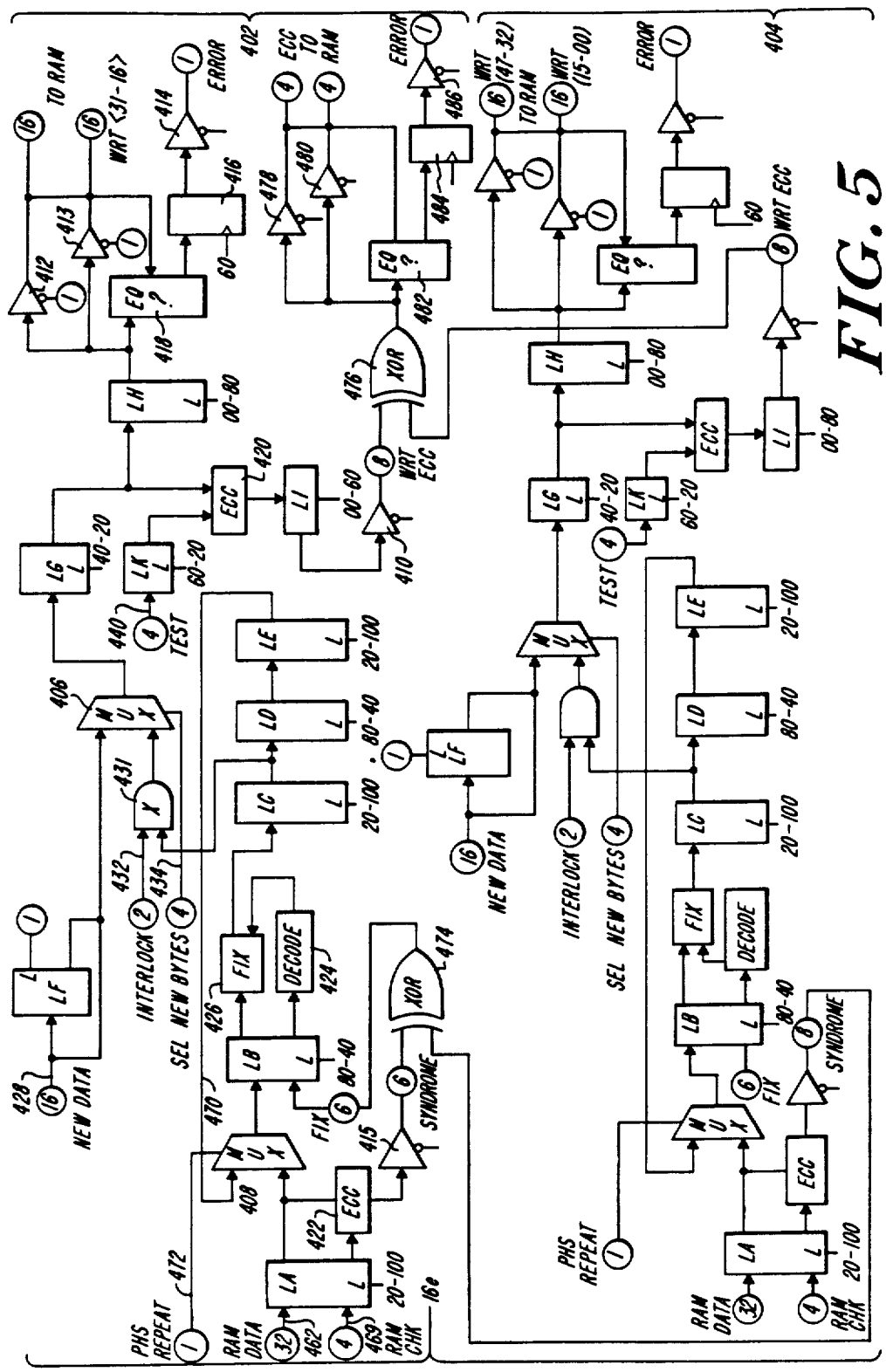
FIG. 5 depicts a preferred architecture for a memory format section of a memory unit constructed in accord with the invention.

FIG. 5 depicts preferred architecture for memory format section 16e memory unit 16. The section 16e is fabricated from a Fujitso 3900 gate array module. The illustrated section 16e, including upper half-word processing sub-section 402 and lower half-word processing sub-section 404, operates in conjunction with memory section 16a, 16b, 16c, 16d to store and access 72-bit memory words. The section 402 and 404 each process 36-bit word portions and are identically constructed. A first partner section (not shown) duplicates section 402 to permit continuous verification of the operation of that sub-section, while a second partner sub-section (not shown) duplicates the operation section of 404 to permit continuous verification of the operation of that sub-section. For clarity, the discussion below is directed to section 402 and its interaction with the other sections. The construction and operation of section 404, as well as first and second partner sections, will be understood accordingly.

The section 402 includes plural data latches designated LA, LB, LC, . . . LK, having associates control lines, each designated as "L". Section 402 also includes multiplexors 406, 408, buffers 410, 412, 413, 414, flip-flop 416, comparator 418, error checking sections (ECC's) 420, 422, decode section 424, and error correction section 426.

The section 402 receives bus data via interface sections 16c, 16d, on line 428, branching to form an input to latch LF as well as to multiplexor 406. An output of latch LF also forms an input to multiplexor 406. A logical AND 431 of an INTERLOCK signal, received on line 432, and an output of latch LC form another input to multiplexor 406. Multiplexor 406 is controlled by a new data select signal received on line 434. An output of multiplexor 406 is directed to latch AG. An input to latch LK provides diagnostic test signals via line 440. Outputs from latch LG are directed to latch LH and ECC 420, as indicated.

An output of ECC 420, representing check bits for 32 data bits, is directed to latch LI. An output that latch is, in turn, directed to buffer 410. Check bits produced at the output of buffer 410 are XOR'ed with check bits produced by section 404 prior to their being written to RAM's 16a, 16b.

An output of latch LH is directed to buffers 412, 413. Outputs from these buffers, representing 16-bits each of the 32 high-order data bits are sent to the RAM's 16a, 16b and compared with similar outputs from the duplicative first processing sub-section. This comparison is performed by comparator 418, having as one input the output of latch LH and having as another input the output from the first processing sub-section. An output from comparator 418 is directed to flip-flop 416. Another input to that flip-flop provides a strobe signal. An output of flip-flop 416 is to buffer 414. The output of that gate signals an ERROR condition in the event the comparator detected an inequality.

The section 402 receives data and check-bits from RAM's 16a, 16b on data and check bits on lines 462 and 464, respectively. One output of latch LA is directed to multiplexor 408, while the other is directed to ECC 422. An output from ECC 422 is directed to gate 415, which generates a partial SYNDROME signal in the event an ECC error is detected.

A loop-back line 470 forms a second input to multiplexor 408 from latch LE. Control for the multiplexor 408 is signalled on line 472 as a PHASE 5 REPEAT. An output from multiplexor 408 is directed to latch LB, as an output from XOR 474, representing syndrome bits. A data output of latch is directed to correcting section 426, while syndrome output of the latch is directed to decode section 424. An output of decode section 424 forms a second input to correcting section 426.

An output of the correcting section 426, representing corrected data, is routed to latch LC. From there, the data is routed to AND gate 431 and to latch LD. Data from latch LD is routed to latch LE, as indicated.

As noted above, lower half-word processing sub-section 404 is constructed identically to upper half-word processing sub-section 402 and operates to process the low-order 36 bits of each 72-bit memory word. The sub-sections 402,404 interact in order to compute error-correcting and syndrome bits. In particular, error correcting bits output at buffer 410 of section 402 are XOR'ed with corresponding bits output by the equivalent buffer of section 404. While the bits output by buffer 410 represent only 32 of the data bits, the EXCLUSIVE OR of those bits with corresponding bits from section 404 provides error-correcting capability for a full 64 data bits.

As indicated by FIG. 5, the output of XOR 476 is directed to buffers 478 and 480, each latching four error-correcting bits. In order to insure the integrity of these error-correcting bits, the output of XOR 476 is compared with the output of the corresponding XOR of the duplicative first processing section. This comparison is performed by comparator 482. In the event of a mismatch of these compared signals, an error bit is generated at buffer 486, after detection at flip-flop 484.

FIG. 5 also illustrates the computation of syndrome bits for words received from the RAM's. In particular, the output of buffer 415 latches the eight syndrome bits for the 32 data bits received at latch LA. These eight syndrome bits are XOR'ed with eight corresponding bits generated in section 404 in order to produce eight error correcting bits. Six of these bits, revealing the location of the erroneous bits, are passed to latch LB, as indicated.

In addition to indicating the component structure of section 16e, FIG. 5 illustrates the data path widths and signal timing for sections 402 and 404. In particular, the bit-wise width of each signal input and output from section 16e is indicated by way of an encircled numeral. Thus for example, section 402 receives a 32-bit input to latch LA on line 462, while the section receives a four-bit input to latch LA on line 464. The remaining numeric indications of FIG. 5 indicate signal timing. Encircled indications of the form "x/yy", where x and y are integers, reveal time intervals in which signals are deemed stable. The "x" portion of the indicator relates to timing phases, while the "yy" portion relates to nanosecond intervals within the timing interval. Thus, for example, the PHASE 5 REPEAT signal received on line 472 is stable in phase #5 during the interval between the 15th and 125th nanosecond. Numeric indications at the latch controls reveal when signals placed on those controls are asserted. Thus, for example, the section 402 asserts the latch LA control during the timing interval between 20 and 100 nanoseconds during each phase of operation.

Figure 6:
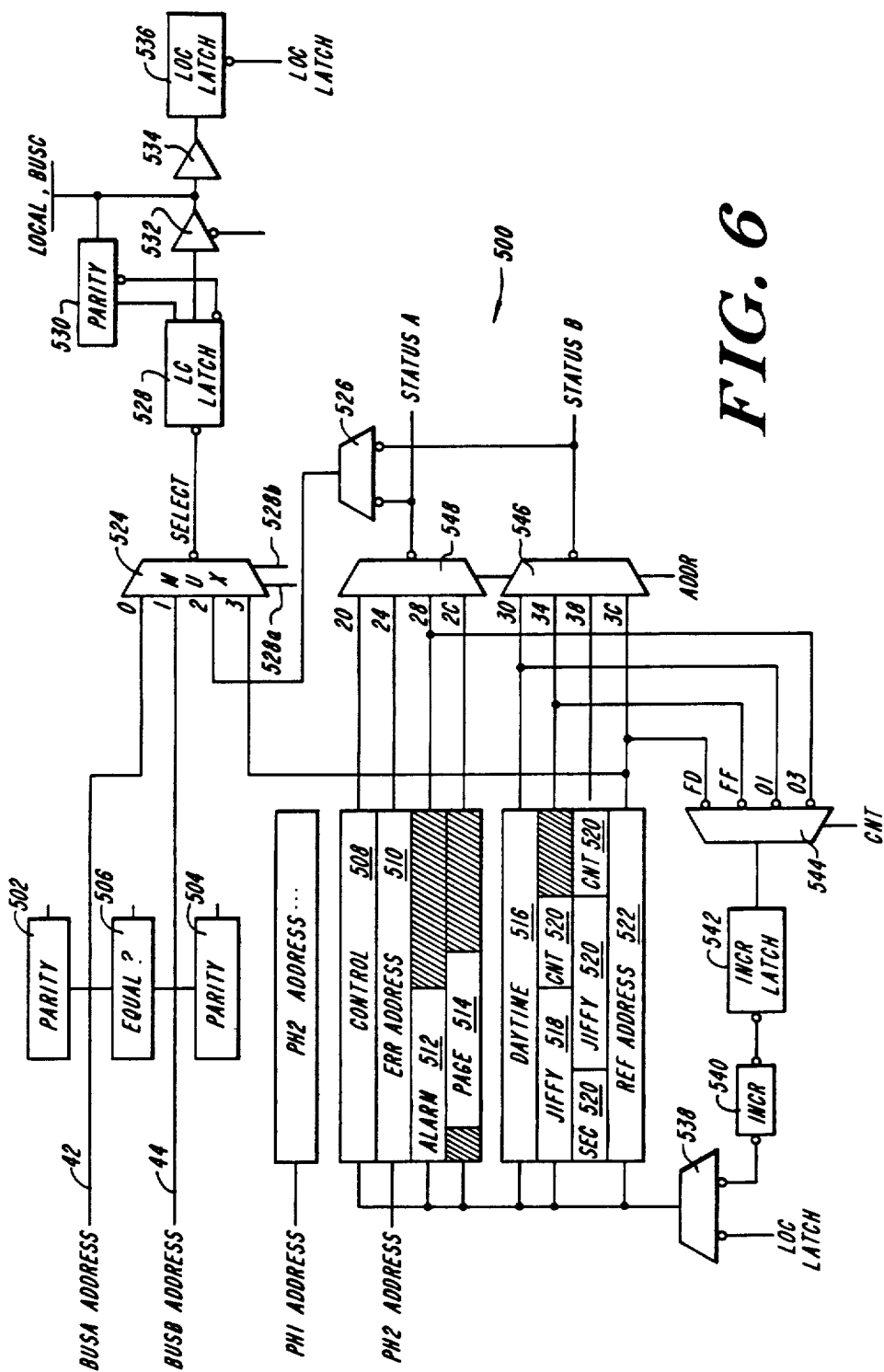
FIG. 6 depicts an architecture for a preferred memory unit gate array, providing an interface between the system bus and sections of the memory unit.

FIG. 6 depicts an architecture for a preferred memory unit gate array 500, providing an interface between the system bus structure 42, 44, 46 and the memory unit sections 16a, 16b, 16c, 16d, and 16e, described above. The illustrated gate array, constructed from a Fujitso 3900 gate array module, includes bus address comparator circuitry, a control register section, and an addressing table. The comparator circuitry includes a first parity element 502 for checking the parity of signals received on the A bus 42. A second parity element 504 checks the parity of signals received on the B bus 44. A comparator 506 compares signals received from both buses 42, 44 to insure duplicity.

The control register section is comprised of plural independently addressable 32-bit latches, including a control latch 508, an error address latch 510, an alarm latch 512, and a page latch 514. The exemplary control latch 508 stores information as follows:

| Bit | Label | Definition |
|---|---|---|
| 31 | ALARM | Causes Interrupt. Set when ALARM underflows. |
| 30 | ALARM SET | Set the ALARM. |
| 29 | COUNTER ON | Enable the main JIFFY counter. |
| 28 | REFRESH ON | Enable the refresh increment. |
| 27-22 | BASE ADDRESS | The base address of the memory unit. |
| 21-19 | MEMORY SIZE | Memory size. |
| 18-16 | LEAF POSITION | Leaf position. |
| 15-09 | COUNTER INIT VALUE | Set in counter when counter overflows. |
| 07-00 | REFRESH INCREMENT | Added to REFRESH ADDRESS at JIFFY time. |

The error address latch 510 is utilized to store addressing information, including phase 3 address and error addresses. The alarm latch 512 is a 16-bit register which is incremented every JIFFY cycle. Upon overflow, the latch 512, if enabled by ALARM SET, causes an interrupt to be sent to the central processor units. The page latch 514 stores the address of the current page of interest.

The gate array addressing table section is comprised of independently addressable 32-bit latches, including daytime latch 516, jiffy latch 518, seconds latch 520, and refresh address latch 522. The daytime latch stores a signal representative of the time of day. The jiffy latch 518 stores, in its high-order bits, a signal representative of the number of elapsed JIFFY intervals In its low-order bits, the latch 518 stores a signal representative of elapsed clock system clock cycles, represented as "CNT". Together, the daytime and jiffy latches 516, 518 represent the time of day in 125 nanosecond intervals.

The seconds latch 520 includes a high-order section representing elapsed seconds. A mid-section represents JIFFY intervals, while a low-order section also represents elapsed system clock cycles. The refresh address latch 522 stores a signal indicative of the address of the section of the RAM that is currently being refreshed.

In the illustrated embodiment, the daytime latch is referenced by memory address 30; the jiffy latch is referenced by memory address 34; the seconds latch is referenced by memory address 38, and the refresh address latch is referenced by the memory address 3C.

The illustrated gate array 500 includes, additionally, routing circuitry for transmitting signals between the various elements. This routing circuitry includes multiplexor 524, having inputs connected to BUS A address line 42, BUS B address line 44, refresh address register 522, and control and address multiplexor 526. Routing selected by multiplexor 524 is determined by control lines 528a and 528b.

An output of multiplexor 524 is directed to latch 528. The output of this latch is, in turn, directed to parity generator 530 and to buffer 532. The output of elements 530 and 532 are directed to the memory local bus, indicated as LOCAL BUS C. Signals travelling along the local bus are available to the memory unit proper for processing as described above in conjunction with FIGS. 3 and 4.

Signals transmitted from the memory unit proper to the gate array 500 are received from LOCAL BUS C at buffer 534. An output of this buffer is directed to local latch. This latch, in turn, is connected to the control and address latches 508–522, via multiplexor 538. A second input to multiplexor 538 is connected to incrementor 540 and its associated latch 542. An input to that latch is multiplexor 544, which routes signals received from selected address and control latches 512 (address 28), 516 (address 30), 518 (address 34), and 522 (address 3C).

Information transmitted from the address and control latches is routed through multiplexors 546 and 548, as indicated. Outputs of these multiplexors are connected to multiplexor 526.

Aside from verifying addressing information received from the bus, the array 500 permits memory-type access to address and control latches, including the daytime latch. Information stored in each of the address and control latches may be obtained by referencing, for example, in a definition phase, the memory unit with the address of the desired address or control latch. For example, the daytime latch may be referenced by sending to the memory unit address 30, causing the time-of-day information to be transferred via local bus C to the data output pins of the memory unit. Thus, by way of further example, the central processor 12 (FIG. 1) can initiate, via system bus conductors 42 and 44, a time-of-day request cycle, i.e., a transfer cycle including a memory-type access referencing the daytime latch address (during the definition phase of the request cycle), thereby causing the memory unit 16 to transmit the time-of-day back along the conductors 42, 44 during the data transfer phase of that cycle.

The gate array circuitry also provides automatic incrementing of various latches in the addressing and control sections. At the outset, overflow from the CNT sections of each of the jiffy and seconds latches 518, 510 flows directly into the high-order sections of each of those latches. Accordingly, the jiffy section of latch 518, as well as the jiffy and second sections of latch 520, are automatically incremented. Moreover, whenever these CNT sections ready "FD" (hexadecimal), the increment circuitry 538–544, causes the refresh address to be incremented. Similarly, when CNT reaches "FF" (hexadecimal), the increment circuitry causes the jiffy latch to be incremented, while at "01" (hexadecimal), the daytime latch is incremented. Accordingly, the refresh and daytime latches remain up-to-date and available for access without intervention of the central processing unit or other outside control.

In a preferred embodiment, the gate array 500 is arranged for generating a JIFFY signal every 15.25 microseconds. During memory testing stages, for example, the JIFFY cycle time can be lengthened, causing the RAM's to be refreshed less often and, thus, to fail with a frequency correlating to their integrity.

Upon insertion of a replacement memory board in the system 10, as discussed above, the initialization sequence is effected. This sequence first involves stopping all counters in the memory system, including those contained in gate array 500. Next, the contents of the control register section and addressing table from the original, non-faulty memory unit are transferred to the partnered replacement board. This memory board pair is signalled to begin the update process, and the memory system counters are restarted.

It will thus be seen that the objects set forth above, among those made apparent from the preceding description, are efficiently attained. It will be understood that changes may be made in the above constructions and in the foregoing sequences of operation without departing from the scope of the invention. It is accordingly intended that all matter contained in the above description or shown in the accompanying drawings be interpreted as illustrative rather than limiting.

Accordingly, what is claimed is:

1. In a digital data processing apparatus utilizing a common bus structure for transferring information between functional units including a processing unit, a peripheral control unit, and first and second memory units, at least the first said memory unit including dynamic storage elements, said apparatus including clock means connected with said functional units for providing signals defining successive timing intervals, said apparatus executing a unit-to-unit information transfer on the bus structure by transferring signals representative of a transfer cycle that occurs during plural timing intervals and includes plural phases, including a definition phase which includes addressing, a response phase, and a data-transfer phase, where the phases of one cycle are non-overlapping and occur in sequence in different respective timing intervals of the transfer cycle, said bus structure including means for carrying definition signals representative of definition phases and data signals representative of data-transfer phases, said functional units pipelining transfer cycles by transferring concurrently on the bus structure signals representative of differing phases of plural cycles, the improvement comprising A. signalling means for periodically generating a JIFFY signal indicative a necessity to refresh at least one said dynamic storage element, B. memory refresh means connected with said first memory unit for normally responding to said JIFFY signal for executing a memory refresh cycle, said refresh cycle refreshing at least one dynamic storage element in said first memory unit, said memory refresh means including means for generating a BUSY signal indicative of onset of said memory refresh cycle, C. said memory refresh means comprises memory update means for responding to said KIFFY signal and to a signal indicating that the second memory unit requires a memory update from the first memory unit for executing a memory update cycle to transfer stored information from said first memory unit to said second memory unit, said memory update means including means for initiating said update cycle during a first timing interval common to first and second pipelined transfer cycles, said memory update means further including means generating a BUSY signal indicative of the onset of said update cycle, and D. pipeline-interrupt means responsive to detection of said BUSY signal for aborting further execution of said first transfer cycle while continuing execution of said second transfer cycle.

2. In apparatus according to claim 1 the further improvement wherein said memory update means includes update-extension means for extending said memory update cycle to include the transfer of further update information from said first memory unit to said second memory unit, said further transfer occurring during at least a second timing interval subsequent to said first timing interval, said update-extension means including means for generating at least one BUSY signal indicative of the transfer of said further update information.

3. An apparatus according to claim 2 wherein

A. said first memory unit comprises plural addressable storage locations for storing signals representative of memory words, B. said memory update means includes means for accessing for transfer memory words from storage locations having successive memory addresses, and C. said memory update means comprises next-update storage means for storing a signal indicative of an address of the next storage location storing signals to be transferred.

4. An apparatus according to claim 3 wherein at least said first memory unit comprises A. a memory leaf including N dynamic memory chips, where N is a finite integer greater than one, and where each memory chip has a plurality of bit storage locations, each said bit storage location being addressable by row and column designations, B. said update means comprises leaf-read means for accessing for transfer bit storage location having common column designations within dynamic memory chips of the memory leaf.

5. An apparatus according to claim 4 wherein said update means further comprises error checking means for checking and correcting bit values accessed by said leaf-read means.

6. An apparatus according to claim 5 wherein said update means comprises memory refresh means for refreshing bit storage location having a common row designation within the dynamic memory chip of said memory leaf.

7. An apparatus according to claim 1 wherein said pipeline-interrupt means comprises A. means for responding to the detection of said BUSY signal for aborting execution of a transfer cycle that is in its response phase, and B. means for responding to the detection of said BUSY signal for continuing execution of a transfer cycle that is in any one of its definition phases or data-transfer phases.

8. In a digital data processing apparatus utilizing a common bus structure for transferring information between functional units including a processing unit, a peripheral control unit, and first and second memory units, said apparatus including clock means connected with said functional units for providing signals defining successive timing intervals, said apparatus executing a unit-to-unit information transfer on the bus structure by transferring signals representative of a transfer cycle that occurs during plural timing intervals and includes plural phases, including a definition phase which includes addressing, a response phase, and a data-transfer phase, where the phases of one cycle are non-overlapping and occur in sequence in different respective timing intervals of the transfer cycle, said bus structure including means for carrying definition signals representative of definition phases and data signals representative of data-transfer phases, said functional units being arranged for pipelining transfer cycles by transferring concurrently on the bus structure signals representative of differing phases of plural cycles, the improvement comprising A. memory update means connected with said memory units for executing a memory update cycle to transferring memory update information from said first memory unit to said second memory unit, said memory update means including means for initiating said update cycle during a first timing interval common to first and second pipelined transfer cycles, said memory update means further including means for generating a BUSY signal indicative of an onset of said update cycle, said memory update means effecting said information transfer without intervention of others of said functional units, and B. pipeline-interrupt means responsive to detection of said BUSY signal for aborting further execution of said first transfer cycle while continuing the execution of said second transfer cycle.

9. An apparatus according to claim 8 wherein

A. said memory update means includes update-extension means for extending said memory update cycle to include the transfer of further update information from said first memory unit to said second memory unit, said further transfer occurring during at least a second timing interval subsequent to said first timing interval, said update-extension means including means for generating at least one BUSY signal indicative of the transfer of said further update information.

10. In a digital data processing apparatus having functional units, including at least a processing unit, a peripheral device control unit, and a memory unit connected along a common system bus, said memory unit including means for storing at addressable locations therein information-representative signals and being responsive to a memory addressing signal received from another of said functional units for generating and transmitting along said common system bus to that other functional unit a signal representative of information stored at the addressed location in the memory unit, the improvement comprising A. time-of-day clock means connected with said functional units for storing a signal representative of at least the time of day, said time-of-day clock means including means responsive to a selected memory addressing signal received from one of said functional units for generating and transmitting along said common system bus to that functional unit a signal representative of the time of day.

11. In apparatus according to claim 10, the improvement wherein

A. said memory unit includes dynamic storage elements,

B. said time-of-day clock means includes means for periodically generating a JIFFY signal indicative a necessity to refresh at least one said dynamic storage element, and C. said memory unit includes refresh means responsive to said JIFFY signal for executing a refresh cycle to refresh said dynamic storage element.

12. In a first functional unit in a digital data processing apparatus that utilizes a common bus structure for transferring information between said first functional unit and other functional units of the digital data processing apparatus, said other functional units including one or more of a processing unit, a peripheral control unit, and a memory unit, said first functional unit including a processing section responsive to input signals received on said bus structure from said other functional units for generating output signals for transmission on said bus structure to said other functional units, said apparatus including clock means connected with said functional units for providing signals defining successive timing intervals, said apparatus executing a unit-to-unit information transfer on the bus structure by transferring signals representative of a transfer cycle that occurs during plural timing intervals and includes plural phases, including a definition phase which includes addressing, a response phase, and a data-transfer phase, where the phases of one cycle are non-overlapping and occur in sequence in different respective timing intervals of the transfer cycle, said bus structure including means for carrying definition signals representative of definition phases and data signals representative of data-transfer phases, said functional units pipelining transfer cycles by transferring concurrently on the bus structure signals representative of differing phases of plural cycles, the improvement wherein said first functional unit comprises A. diagnostic means connected with said processing section for performing a diagnostic cycle thereon during at least a first timing interval common to first and second pipelined transfer cycles, said diagnostic means including means for generating a BUSY signal indicative of onset of set diagnostic cycle, and B. pipeline-interrupt means responsive to detection of said BUSY signal for aborting further execution of said first transfer cycle while continuing the execution of said second transfer cycle.

* * * * *

UNITED STATES PATENT AND TRADEMARK OFFICE
CERTIFICATE OF CORRECTION

PATENT NO. : 4,866,604

DATED : September 12, 1989

INVENTOR(S) : Robert Reid

It is certified that error appears in the above-identified patent and that said Letters Patent is hereby corrected as shown below:

Column 1, lines 49-50, replace "continuous. Processing" with -- continuous processing --.

Column 5, line 64, after "32 Mbytes" insert -- , --.

Column 5, line 64, after "leaves" insert -- , --.

Column 8, line 5, replace "infra" with -- *infra* --.

Column 10, line 13, replace "Phase" with -- phase --.

Column 11, line 59, replace "cycle numbering" with -- cycle-numbering --.

Column 15, line 40, after "memory" insert -- gate --.

Column 15, line 41, replace "infra" with -- *infra* --.

Column 18, line 3, replace "form" with -- from --.

UNITED STATES PATENT AND TRADEMARK OFFICE
CERTIFICATE OF CORRECTION

PATENT NO. : 4,866,604

DATED : September 12, 1989

INVENTOR(S) : Robert Reid

It is certified that error appears in the above-identified patent and that said Letters Patent is hereby corrected as shown below:

Column 20, line 53, replace "7C, C," with -- 7C, 6C, --.

Column 20, line 54, after "RAM" insert -- 292 --.

Column 26, line 42, after "intervals" insert -- . --.

Column 28, line 55, replace "KIFFY" with -- JIFFY --.

Column 28, line 65, after "means" insert -- for --.

Signed and Sealed this

Eleventh Day of December, 1990

Attest:

HARRY F. MANBECK, JR.

Attesting Officer

Commissioner of Patents and Trademarks